US007435362B2

(12) United States Patent
Muraoka et al.

(10) Patent No.: US 7,435,362 B2
(45) Date of Patent: Oct. 14, 2008

(54) REDOX-SWITCHABLE MATERIALS

(75) Inventors: Masahiro Muraoka, Shiga-ken (JP); Stephen L. Gillett, Carson City, NV (US); Thomas W. Bell, Reno, NV (US)

(73) Assignee: The Board of Regents of the Nevada System of Higher Education on behalf of the University of Navada, Reno, NV (US)

( * ) Notice: Subject to any disclaimer, the term of this patent is extended or adjusted under 35 U.S.C. 154(b) by 146 days.

(21) Appl. No.: 10/500,433

(22) PCT Filed: Dec. 30, 2002

(86) PCT No.: PCT/US02/41773

§ 371 (c)(1),
(2), (4) Date: Apr. 28, 2005

(87) PCT Pub. No.: WO03/058692

PCT Pub. Date: Jul. 17, 2003

(65) Prior Publication Data

US 2005/0227071 A1    Oct. 13, 2005

Related U.S. Application Data

(60) Provisional application No. 60/344,107, filed on Dec. 28, 2001.

(51) Int. Cl.
*G02F 1/015* (2006.01)
(52) U.S. Cl. .................. 252/582; 257/431; 428/689; 428/447; 430/270.16
(58) Field of Classification Search ........................ None
See application file for complete search history.

(56) References Cited

U.S. PATENT DOCUMENTS

| | | | |
|---|---|---|---|
| 4,710,476 A | | 12/1987 | Ellis et al. |
| 5,021,592 A | * | 6/1991 | Beer et al. ............ 556/1 |
| 5,021,599 A | | 6/1991 | Beer et al. |
| 5,198,081 A | | 3/1993 | Kanoh et al. |
| 5,208,154 A | | 5/1993 | Weaver et al. |
| 5,286,571 A | | 2/1994 | Mirkin et al. |
| 5,332,508 A | | 7/1994 | Foster et al. |
| 5,724,187 A | * | 3/1998 | Varaprasad et al. ......... 359/608 |
| 6,461,820 B1 | | 10/2002 | Barton et al. |
| 6,605,239 B2 | | 8/2003 | Fitzmaurice et al. |
| 2002/0021482 A1 | | 2/2002 | Fitzmaurice et al. |
| 2003/0081463 A1 | * | 5/2003 | Bocian et al. ............... 365/200 |

OTHER PUBLICATIONS

"Silicon-based Molecular Nanotechnology" authored by Hersam et al. and published in Nanotechnology, 2000, 11, 70-76.*
"Alkylation of Porous Silicon by Direct Reaction with Alkenes and Alkynes" authored by Bateman et al. and published in Angew Chem Int. Ed., 1998, 37 (19) 2683-2685.*

Akabori et al. (1995) "Synthesis of Photoresponsive Crown Ethers Having a Phosphoric Acid Functional Group as Anionic Cap and Their Selective Complexing Abilities Toward Alkali Metal Cations," *Perkin Trans* 1:2589-2594.
Albagli et al. (1993)"Surface Attachment of Well-Defined Redox-Active Polymers and Block Polymers via Terminal Functional Groups," *J. Am. Chem. Soc.* 115:7328-7334.
Al'fimov et al. (1991) "Molecular Design, Photoisomerization and Complexation of Crown Ether Styryl Dyes," *Chem. Phys. Lett.* 185:455-460.
Ameerunisha et al. (1995) "Characterization of Simple Photoresponsive Systems and Their Applications to Metal Ion Transport," *Perkin Trans.* 2:1679-1682.
Anicet et al. (1998) "Electron Transfer in Organized Assemblies of Biomolecules. Construction and Dynamics of Avidin/Biotin Co-Immobilized Glucose Oxidas/Ferrocene Monolayer Carbon Electrodes," *J. Am. Chem. Soc.* 128:7115-7116.
Audebert et al. (1996) "Modified Electrodes from Organic-Inorganic Hybrid Gels Formed By hydrolysis- Polycondensation of Some Trimethoxysilylferricenes," *J. Electroanal. Chem.* 413:89-96.
Barrett et al. (1995) "Anion and Solvent-Dependent Photochemical Decomplexation of Sodium Salt Complexes of a Calix[4]Arene Tetraester," *Chem. Commun.* p. 363.
Bashkin (1990) "Oxygen-Stable Ferrocene Reference Electrodes," *Inorg. Chem.* 29:4507-4509.
Blank et al.(1981) "Photoregulated Ion Binding," *Science* 241:70-72.
Blonder et al. (1996) "Application of Redox Enzymes for Probing the Antigen0Antibody Association at Monolayer Interfaces: Development of Amperometric Immunosensor Electrodes," *Anal. Chem.* 68:3151-3157.
Bocarsly et al. (1980) "Use of Chemically Derivatized n-type Silicon Photoelectrodes in Aqueous Media. Photooxidation of Iodide, Hexacyanoiron(II), and Hexaammineruthenium(II) at Ferrocene-Derivatized Photoanodes," *J. Am. Chem. Soc.* 102:3390-3398.
Bolts et al. (1978) "Chemically Derivatized n-type Semiconducting Germanium Photoelectrodes. Persistent Attachement and Photoelectrochemical Activity of Ferrocene Derivatives," *J. Am. Chem. Soc.* 100:5257-5262.

(Continued)

*Primary Examiner*—Marc S Zimmer
(74) *Attorney, Agent, or Firm*—Greenlee, Winner and Sullivan P.C.

(57) ABSTRACT

The invention relates to redox-switchable material comprising a redox-active moiety adsorbed, bonded or both, to a semiconductor material. Among the preferred redox-active moieties disclosed herein are ferrocenes, acridines, and quinones though any such moiety may be employed. The redox-switchable material of this invention may be used to selectively remove one or more selected solutes from an aqueous solution wherein adsorption/complexation of the solute is influenced by the oxidation state of the redox-active moiety. In an alternative embodiment, inclusion moieties that are covalently bound to the redox-active moiety are employed to achieve selective complexation of the desired solute. Other possible applications of the disclosed materials are photo-erasable writing media, electrochromic or photochromic materials, catalysis, and solar energy storage.

34 Claims, 2 Drawing Sheets

OTHER PUBLICATIONS

Bolts et al. (1979) "Chemically Derivatized n-type Semiconducting Gallium Arsenide Photoelectrodes. Thermodynamically Uphill Oxidation of Surface-Attached Ferrocene Centers," *J. Am. Chem. Soc.* 101:6179-6184.

Bolts et al. (1979) "Chemically Derivatized n-type Silicon Photoelectrodes. Stabilization to Surface Corrosion in Aqueous Electrolyte Solutions and Mediation of Oxidation Reactions by Surface-Attached Electroactive Ferrocene Reagents," *J. Am. Chem. Soc.* 101:1378-1385.

Bruening et al. (1997) "Synthesis and Characterization of Surface-Grafted Hyperbranched Polymer Films Containing Fluorescent, Hydrophobic, Ion-Binding, Biocompatible, and Electroactive Groups," *Langmuir* 13:770-778.

Bu et al. (1995) "Characterization of a Ferrocene-Containing Polyacrylamide-Based Redox Gel for Biosensor Use," *Anal. Chem.* 67:4071-4076.

Chambliss et al. (1998) "Rapid and Selective Redox-Recyclable Anion-Exchange Materials Containing Polyalkylated Ferrocenium Anion-Exchange Sites," *Inorg. Chem. Commun.* 1:435-438.

Chao et al. (1983) "A New Ferrocenophane Surface Derivatizing Reagent for the Preparation of Nearly Reversible Electrodes for Horse Heart Ferri-/ferrocytochrome c: 2,3,4,5-tetramethyl-1-[(dichlorosiyl)methyl][2]ferrocenophane," *J. Am. Chem. Soc.* 105:181-188.

Chen et al. (1994) "Chemically Modified Electrodes by Nucleophilic Substitution of Chlorosilylated Platinum Oxide Surfaces," *Langmuir* 10:3332-3337.

Chen et al. (1992) "Cobalt-Mediated Modification of Oxide Surfaces with Redox-Active Molecules," *Langmuir* 8(11):2585-2587.

Ching et al. (1995) "Synthesis and Reactivity of Modified Electrodes Derived from $TiCl_4$ and Other Early-Transition-Metal Complexes," *Chem. Mater.* 7:405-411.

Ching et al. (1994) "Surface Modification of Carbon and Platinum Electrodes Using $Ticl_4$," *Langmuir* 10:1657-1659.

DiGleria et al. (1992) "Covalent Linkage of Glucose Oxidase to Modified Basal Plane Pyrolytic Graphite Electrodes and the Use in the Ferrocene-Mediated Amperometric Measurement of Glucose," *Inorg. Chim. Acta.* 198-200:863-866.

Effing et al. (1995) "Photoswitchable Phase Separation in Hydrophobically Modified Polyacrylamide/Surfactant Systems," *Angew. Chem. Int. Ed. Engle.* 34:88-90.

Foster et al. (1993) "Reversible Photoreductive Deposition and Oxidative Dissolution of Copper Ions in Titanium Dioxide Aqueous Suspensions," *Environ. Sci. Technol.* 27(2):350.

Foster et al. (1995) Effect of Organics on the Photodeposition of Copper in Titanium Dioxide Aqueous Suspensions, *Ind. Eng. Chem. Res.* 34(11):3865-3861.

Fuerstner et al. (1996) "Syntheses, Structures, and Complexation Properties of Photoresponsive Crownophanes," *Liebigs Ann.* 655-662.

Gronet et al. (1983) "n-Type Silicon Photoeletrochemistry in Methanol: Design of a 10.1% Efficient Semiconductor/Liquid Junction Solar Cell," *Proc. Natl. Acad. Sci. USA* 80:1152-1156.

Hale (1991) "Amperometric Glucose Biosensors Based on Redox Polymer-Mediated Electron Transfer," 63:677-682 *Anal. Chem.*

Hankins et al. (1996) "Immobilization of Crown Ehter Carboxylic Acids on Silica Gel and Their use in Column Concentration of Alkali Metal Cations from Dilute Aqueous Solutions," *Anal. Chem.* 68(17):2811-2817.

Irie et al. (1985) "Photoresponsive Molecular Tweezers. Photoregulated Ion Capture and Release Using Thioindigo Derivatives Having Ethylenedioxy Side Groups," *J. Am. Chem. Soc.* 107:1024-1028.

Izatt et al. (1991) "Heavy Metal Removal Using Bound Macroocycles," *Water Sci. Technol.*, 23(1-3):301-308.

Izatt et al. (1996) "Selective Separation Using Supported Devices," in D.N. Reinhoudt, ed., *Comprehensive Supramolecular Chemistry*, vol. X, Pergmon, ch1. pp. 1-11.

Kashiwagi et al.(1998) "Construction of a Complete Bioelectrocatalytic Electrode Composed of Alcohol Dehydrogenase- and All Electron-Transfer Components-Modified Graphite Felt for Diol Oxidation," *Chem. Lett.* (2):143-144.

Kimura, K. (1996) "Photocontrol of Ionic-Conduction by Photochromic Crown-Ethers," *Coord. Chem. Rev.* 148:41-61.

Kimura et al. (1994) "Cation Complexation, Photochromism, and Reversible Ion-Conducting Control of Crowned Spironaphthoxazine," *J. Org. Chem.*, 59:1251-1256.

Kimura et al. (1997) "All-or None Type Photochemical Switching of Cation Binding with Malachite Green Carrying a Bis(monoazacrown ether) Moiety," *J. Am. Chem. Soc.*, 119:2062-2063.

Legg et al. (1977) "n-Type Si-based Photoelectrochemical Cell: New Liquid Junction Photocell using a Nonaqueous Ferricenium/Ferrocene Electrolyte,"0 *Proc. Natl. Acad. Sci. USA*, 74:4116-4120.

Marguerettaz et al. (1994) "Heterodyads: Electron Transfer at a Semiconductor Electrode-Liquid Electrolyte Interface Modified by an Absorbed Spacer-Accepto Complex," *J. Am. Chem. Soc.* 116:2629-2630.

Marquis et al. (1998) "Synthesis and Cation Complexing Properties of a New Type of Photoactive Coronands. Towards Photocontrol of Na+ Complexation," *Tetrahedron Lett.*, 39:35-38.

Martin et al. (1996) "Steady-State and Picosecond Spectroscopy of Li+ or Ca2+ Complexes with a Crowned Merocyanine. Reversible Photorelease of Cations," *J. Phys. Chem.*, 100:6879-6888.

Moutet et al. (1996) "Electropolymerization of Ferrocene Bis-Amide Derivatives: A Possible Route to an Electrochemical Sensory Device," *J. Electroanal. Chem.* 410:79-85.

Muraoka et al. (2002) "Reversible Photoinsertion of Ferrocene into a Hydrophobic Semiconductor Surface: A Chemionic Switch" *Angew. Chemie Int. Ed.*; 41(19):3653-3655.

Saji et al. (1986) Electrochemical Ion Transport with Ferrocene Functionalized Crown Ether, *Chem. Commun.*, 1986, pp. 716-717.

Schuhmann et al. (1991) "Electron Transfer Between Glucose Oxidase and Electrodes Via Redox Mediators Bound with Flexible Chains to the Enzyme Surface," *J. Am. Chem. Soc.* 113:1394-1397.

Shinkai et al. (1981) "Photoresponsive Crown Ethers. Part. 3. Photocontrol of Ion Extraction and Ion Transport by Several Photofunctional Bis(crown ethers)," *Perkin Trans.* 1:3279-3283.

Shinkai, Seiji (1996) "Switchable Guest-Binding Receptor Molecules," in G. Gokel, ed., *Comprehensive Supramolecular Chemistry*, vol. I, Pergamon, 1996, ch. 18, pp. 671-700.

Shinkai et al. (1987) "Photoresponsive Crown Ethers. Part 18. Photochemically Switched-on Crown Ethers Containing an Intra-Snnular Azo Substituent and their Application to Membrane Transport," *Perkin Trans.* 1:449-56.

Shinkai et al. (1982) "A New "Switched-On" Crown Ether Which Exhibits a Reversible All-or-None Ion- Binding Ability," *Tetrahedron Lett.*, 23:2581-2584.

Shinkai et al. (1983) "Photoresponsive Crown Ethers. 8. Azobenzenophane-Type Switched-on Crown Ethers Which Exhibit an All-or-Nothing Change in Ion-Binding Ability," *J. Am. Chem. Soc.*, 105:1851-1856.

Shinkai et al. (1982) "Photoresponsive Crown Ethers. Part 6. Ion Transport Mediated by Photoinduced Cis-Trans Interconversion of Azobis(benzocrown ethers)," *Perkin Trans.* 1:2735-2739.

Stauffer et al. (1997) "Optical Control Over Pb2+ Binding to a Crown Ether-Containing Chromene," *Chem. Commun.*, :287-288.

Takeshita et al. (1998) "Photoresponsive Cesium Ion Tweezers with a Photochromic Dithienylethene," *Tetrahedron Lett.*, 39:613-616.

Tatistcheff et al. (1995) "Charge-Transfer-to-Solvent Photochemistry of Electrode-Confined Ferrocene- and Cobaltocene-Based Polymers: Photoelectrochemical Reduction of Halocarbons," *J. Phys. Chem.*, 99:7689-7693.

Tucker et al. (1997) "A Novel Crown Ether-Cryptand Photoswitch," *Chem. Commun.*, :1165-6.

Wang (1995) "Ferrocene-Conjugated Polyaniline-Modified Enzyme Electrodes for Determination of Peroxides in Organic Media," *Anal. Chem.* 67:1109-1114.

Winkler et al. (1989) "Photodynamic Transport of Metal Ions," *J. Am. Chem. Soc.*, 111:769-770.

\* cited by examiner

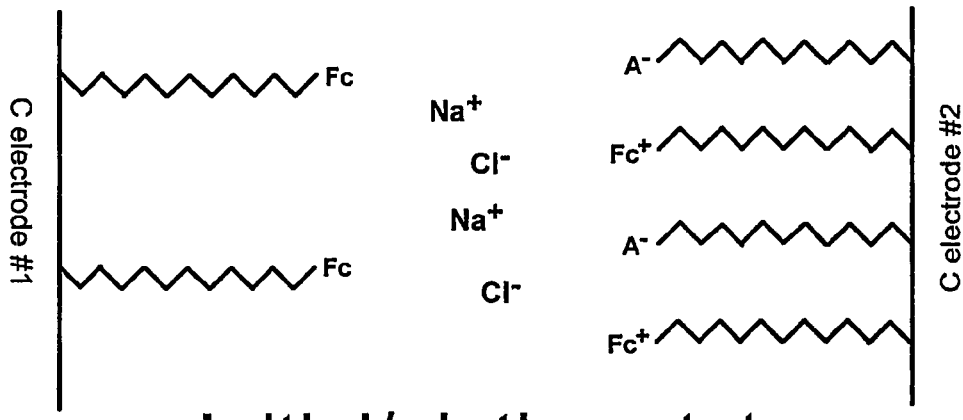
Initial/elution state
(both electrodes neutral)
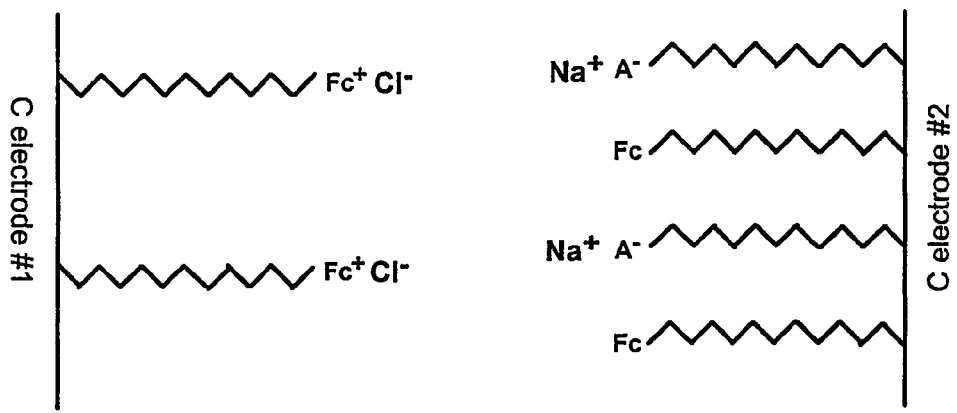
Sorption state
(electrodes charged)
Figure 2:. Electrode surfaces with "latchable" charges due to attached reversible redox species. Fc = ferrocene; $Fc^+$ = ferricenium; $A^-$ = tethered anionic group; $Cl^-$ = solution chloride; $Na^+$ = solution sodium.

REDOX-SWITCHABLE MATERIALS

CROSS-REFERENCE TO RELATED APPLICATIONS

This application is the national stage of International Application No. PCT/US02/41773, which application takes priority under 35 U.S.C. 119(e) from U.S. provisional application 60/344,107, filed Dec. 28, 2001, both of which are incorporated in their entirety by reference herein.

BACKGROUND OF THE INVENTION

The present invention relates generally to materials that comprise a redox-active moiety and which are selectively reversibly switchable between a reduced state and typically one oxidized state (i.e., redox-switchable). The redox state of the material may be switched chemically (e.g., oxidizing or reducing agents), electrochemically (e.g., by contact with electrodes, or use of redox-active reagents) and/or photochemically. Materials of interest include solid materials in which a redox-active moiety is adsorbed, bonded or both to a surface of the solid so that switching of the redox state of the redox-active moiety affects the properties of that surface, e.g. charge, and/or or affects adsorption or bonding to that surface. Of particular interest are solids incorporating a photoactive semiconductor, preferably a photoactive oxide semiconductor, and a redox-active moiety from which electron-hole pairs can be generated on irradiation to switch redox state.

Redox switchable materials in general have application as redox switches (e.g., selectively changing the redox state or charge of an environment), in sensors and other analytic devices or methods, for selective removal, release or transport of ions, and as catalysts. Such materials may also find application in the control of self-assembly related to molecular devices (Muraoka, 2002 and references therein).

A material whose redox or charge state can be "switched" by external triggers such as light, electricity, or chemical potential has more specific application for use in extraction of solutes from solution; in electrochromic materials, whose optical properties (e.g., color, reflectivity, transparency) change on application of an electric field; in reusable writing media or data storage applications; and in electrocatalysis in which electricity is employed to drive chemical reactions, e.g. to carry out more efficient syntheses of valuable products or to store electricity by making fuel. Photo redox-switchable materials can additionally be employed generally in solar energy applications for storage of light energy in chemical forms for making fuel.

The extraction of species from solution (herein referred to generally as solutes) by adsorption to a solid is well known, as exemplified by the use of ion-exchange resins and zeolites. Furthermore, the specific "recognition" of particular solutes by other molecules, which bind to the solutes preferentially due to complementary fitting of shape, charge, polarizability, etc. has been the subject of extensive research over the last few decades. Macrocyclic compounds, such as crown ethers and cryptands, among others, are examples of compounds that are now being applied as selective adsorbers or binding agents to the selective extraction of solutes from aqueous solution (e.g., Izatt et al., 1991, 1996; Hankins et al., 1996).

These extraction methods, however, suffer from an "elution problem". Once the adsorber or binding agent is saturated with the extracted solute, release or removal of the solute from the adsorber or binding agent to recover the solute and/or reuse the adsorber or binding agent can be difficult and expensive. This is particularly true when adsorption or binding is highly selectivity. The elution of the solute, and concomittant regeneration of the adsorber, is typically carried out under extreme chemical conditions. In commercial hydrometallurgy, for example, aurocyanate adsorbed onto activated carbon must be removed by elution with strong basic solution. Similarly, the release of heavy metals that have been extracted by crown ethers tethered to silica requires elution in strong acid (e.g., ~1 M HCl; Izatt et al., 1991). Even the regeneration of the ion-exchange resin in an ordinary household water-softener requires flushing with concentrated NaCl brine. Release of solute and regeneration of the adsorber or binding agent can be expensive and/or wasteful in application of energy or materials. In applications to water purification, the result of use of such selective adsorbers or binding agents is often the generation of a greater volume of aqueous waste than the volume of water purified. While such costs and/or waste can be tolerated in particular applications, from a global perspective such purification technologies hinder rather than help the goal of water purification.

Materials in which adsorption and/or binding affinity can be selectively changed would provide improved adsorber and or binding agents. Redox-switchable materials which also incorporate a selective complexing or binding moiety and in which the complexing or binding affinity is affected by redox state would provide selectively switchable adsorber or binding agents useful for overcoming the elution problem discussed above.

Much research has been described on homogeneous, solution-based systems involving redox-activated binding, e.g., involving functionalized ferrocenes. See, for example, Allgeier, 1997; Beer, 1998; Beer, 1996; Beer, 1995; Beer, 1994; Beer, 1993; Beer, Chem. Commun., 1993; Chen, 1995; De Santis, 1992; Hall, 1997; Hall, 1993; Kaifer, 1996; Lloris, 1998; Plenio, 1997; Plenio, Chemische Berichte, 1997; Plenio, 1995; and Su, 1999.

Certain redox-switchable materials exhibit binding affinity that is a function of the redox state. For example, the "ferrocene cryptand" molecule 1 (1,1'-[(1,7-dioxa-4,10-diazacyclododecane-4,10-diyl)diethoxy]-3,3',4,4'-tetraphenylferrocene) displays selective, redox-switchable binding. The ferrocene moiety undergoes reversible one-electron oxidation, while the cryptand moiety (the nitrogen- and oxygen-containing ring) binds selectively to cations that fit within the ring. This binding is disrupted when the ferrocene is switched into the oxidized state, because of electrostatic repulsion between the bound cation and the positive charge on the Fe atom.

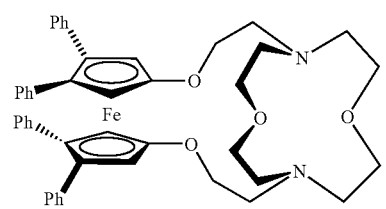

1

The applications that have been proposed for these homogeneous systems are in sensors for detecting small quantities of solutes, in which binding to the ferrocene would cause a measurable change in potential. Redox-active species are not adsorbed or bonded to solid surfaces. Neither oxidation nor reduction in these systems is reported to be light- or electrically driven. Homogeneous, solution-based redox-activated binding systems have been reported for use in extraction or separation, for example Clark, 1999; Clark, 1996; Strauss, 1999; and Tendero, 1996. For example, Saito, 1986 report the use of a ferrocene functionalized crown ether for electrochemical ion transport. Redox switching is done chemically, not photochemically or electrochemically. Chambliss, 1998 report the use of modified ferrocenes sorbed (no covalent bonding was reported) to silica for recyclable anion-exchange materials.

The attachment of redox-active moieties, such as modified ferrocenes, to electrode surfaces have been reported. See: Albagli, 1993; Anicet, 1998; Audebert, 1996; Blonder, 1996, Bruening, 1997; Bu, 1995; Chao, 1983; Chen, 1994; Ching, 1995; Ching, 1994; Di Gleria, 1992; Hale, 1991; Moutet, 1996; Schuhmann, 1991; and Wang, 1995. Most of these reports have been directed toward the detection and analysis of specific solutes, particularly for biological applications where very small amounts of solutes are involved. Release of solutes from electrodes in such applications is not a major concern. The ferrocene/ferricenium couple has also been widely used for an electrochemical reference standard e.g., Bashkin, 1990.

In specific embodiments, this invention relates to materials in which changes in adsorption or binding affinity are photo-induced. Specifically, the invention relates to redox-switchable materials in which photo-induced redox-switching is mediated by a photoactive semiconductor.

A number of systems involving photoswitchable binding of a solute species have been described. These are not semiconductor based, but utilize photoactive organic molecules of various sorts in which the mechanism of photoactivation (e.g., photoisomerization, photocleaving) is very different. Homogenous systems involving photoactive species in solution not affixed to a surface have been reported. Reports include photoactivated binding to macrocyclic compounds including crown ethers and cryptands. See: Akabori, 1995; Al'fimov, 1991; Barrett, 1995; Blank, 1981; Fuerstner, 1996; Irie, 1985; Kimura, 1997; Marquis, 1998; Martin, 1996; Shinkai, 1996; Shinkai, 1987; Shinkai, 1982; Shinkai, 1983; Stauffer, 1997; and Tucker, 1997. Insofar as potential applications have described they are generally directed toward sensing. Research has also focused on photosystems that are models of biological systems.

Systems involving photoswitchable binding of a solute species directed toward extraction, separation or ion transport have been reported, but they relate to homogeneous, solution-based systems. See: Ameerunisha, 1995; Effing, 1995; Kimura, 1996, Kimura, 1994; Shinkai, 1981; Shinkai, 1982; Takeshita, 1998; and Winkler, 1989. These reports do not involve redox-active moieties attached to a surface.

Photoswitching of membrane permeability has been reported. See: Anzai, 1994; Aoyama, 1990; Fujinami, 1993; Hauenstein, 1990; Kumano, 1983; Okahata, 1984; Schultz, 1977.

These applications are directed toward extraction or separation, but they do not involve affixing selective, switchable binding moieties to a surface. Instead, they involve mediated solution transport through a membrane. They also are not semiconductor-based.

Semiconductor-mediated photoreduction of species out of aqueous solution, particularly metal ions, is well-known in the art. See, for example, Borgarello, 1985; Borgarello, 1986; Brown, 1985; Chenthamarakshan, 1999; Curran, 1985; Eliet, 1998; Herrmann, 1988; Jacobs, 1989; Serpone, 1987; and Tanaka, 1986. Photoreduction of metal ions onto semiconductor surfaces has been proposed as technique for extraction of metal from solution (e.g., Borgarello, 1985; Borgarello, 1986; and Herrmann, 1988). A major obstacle in the practical application of such methods has been economical removal of the metal and regeneration of the semiconductor surface. Photoreduction has also been employed for photodepositing metals, e.g., in patterns onto semiconductor substrates, and is one technique for so-called "electroless deposition". This technique has been applied where deposition is intended to be permanent.

Ionic dyes have also been photoreduced in colloidal semiconductor suspensions. See, for example, Brown, 1984; Yoneyama, 1972; Gopidas, 1989; and Vinodgopal, 1994. However, none of the systems described is switchable, and none involves a redox-active moiety adsorbed or bound to a solid.

One semiconductor-based light-driven switchable system for dissolution of metal ions has been described which is based on the reversible photoreduction of aqueous cupric ion ($Cu++$) to an insoluble cuprous ($Cu+$) complex on the semiconductor. See: U.S. Pat. No. 5,332,508; Foster, 1993 and Foster, 1995. The $Cu+$ complex reoxidizes on exposure to air, with return of $Cu++$ to solution. Photoreduction apparently must be carried out in the absence of oxygen. Further, an organic co-solvent is apparently required as a "hole scavenger." Photoreduction does not occur in simple aqueous solution, evidently because the co-solvent acts as a chelating agent for $Cu+$. Organic contaminants or added organics in treated solutions are photooxidized. This system does not employ a redox-active moiety adsorbed or bound the semiconductor.

Redox-switched extraction by electrochemically controlled reversible intercalation and de-intercalation into redox-active crystals on functionalized electrode surfaces has been reported for lithium ion recovery (U.S. Pat. No. 5,198, 081 and Kanoh, 1993) and Cesium ion separation (Lilga, 1999). These applications do not involve surface immobilization of particular redox-active binding agents and are never photodriven. Photodriven insertion of dissolved species into crystal lattices has been reported See, for example, Betz, 1985; Betz, 1984; Betz, J. Appl. Electrochem., 1984; Tributsch, 1980; and Tributsch, 1983. These reports do not involve surface binding of redox-active moieties and protons, rather than metal ions, are the intercalating species.

Redox-switchable materials also have potential application in electrosorption; data storage; and light energy storage. "Electrosorption", the extraction of ions from aqueous solution by electric fields, is conventionally accomplished by electrostatic adsorption of counterions to electrodes surfaces (Johnson, 1971). Recent interest focuses on high-surface-area electrodes such as carbon aerogels (Farmer, 1996). Redox-active electrodes have been mentioned only in the context of "pseudocapacitance" for boosting the capacity of so-called "ultracapacitors" (Conway, 1997). Redox-swichable materials have apparently not as yet been applied in such applications.

The use of photoactive molecules for bitwise storage in computer memories have been reported. See, for example, Feringa, 1993; Tsivgoulis, 1995; and Willner, 1997.

Solar energy is expected to become a major primary energy source in the next few decades. Its disadvantages are well known, as it is both diffuse and intermittent. An attractive approach to solving these problems is the one already taken by plants: trapping the energy of sunlight into chemical bonds. Such "artificial photosynthesis", the use of sunlight to produce fuel, has a literature stretching back to the early 1970s (e.g., Fukujima & Honda, 1972; Bard & Fox, 1995; Bolton, 1996) although it is not yet practical. Photo-switchable redox active materials in which the energy of the absorbed photons can be trapped in a chemical form can be applied to solar enegay storage.

Photoactive semiconductors such as Si and GaAs functionalized with ferrocene moieties have been proposed for applications in artificial photosynthesis. See: Bocarsly, 1980; Bolts, 1978; Bolts, 1979; Bolts, 1979, pp. 1378-85; Gronet, 1983; Kashiwagi, 1998; Legg, 1977; and Tatistcheff, 1995. The functionalization was employed to shield the semiconductor from corrosion by the aqueous solution. In contrast to oxide semiconductors, Si and GaAs semiconductors readily photooxidize in water. Ferrocene is not used as an energy-storage couple in these applications.

There is a significant need in the art for redox-switchable materials for the various applications noted above and in particular for photo-driven or activated redox-switchable materials. The present invention provides improved solid phase redox-switchable materials.

SUMMARY OF THE INVENTION

The invention provides redox-switchable material which comprises a redox-active moiety adsorbed, bonded or both to a solid surface. In one aspect the solid is a semiconductor material, for example a photoactive oxide semiconductor. In another aspect the solid is an electrode surface.

The redox-switchable material herein functions for selective adsorption, binding or complexing of one or more selected solutes wherein adsorption, binding or complexing of the solute is affected by the redox state of the material. The redox-active moiety may exhibit selective adsortion, binding or complexing or the redox-active moiety may be covalently bonded to a distinct moiety which exhibits selective adsortion, binding or complexing.

The redox-switchable material can comprise a hydrophobic semiconductor material. The semiconductor material can be rendered hydrophobic by adsorption, complexation or by ionic, hydrogen or covalent bonding of hydrophobic species. Preferably the hydrophobic species are not themselves redox-active under application conditions. Preferred hydrophobic semiconductor materials have hydrocarbyl moieties, e.g., alkyl, alkenyl, alkynyl or aryl, covalently attached to the surface of the semiconductor material. Hydrophobic semiconductor materials include those in which the surface is coated with a layer of hydrophobic species or a species that is largely hydrophobic, for example a surfactant. The hydrophobic moieties are preferably bonded to the semiconductor surface via O—Si— groups. The semiconductor material can be in the form of particles, which typically are powders or finely divided powders, or may be provided as a surface layer on a substrate, such as glass or ceramic or a plastic or polymer. The semiconductor materials may be provided in pores or channels formed in a substrate material. Oxide semiconductor materials are preferred.

The redox-active moiety is preferably covalently bonded to the semiconductor surface and is optionally covalently bonded through a linker group. The linker group can be comprised of any chemical species that are not oxidized or reduced by irradiation of the semiconductor and preferably are substantially alkyl linkers. For example, the redox-active moiety can be covalently linked to the semiconductor surface via a —($CH_2$)n— chain, wherein n is 2 or more, preferably is 6 or more and more preferably is 10 or more. Preferred linkers do not contain —NH— or —O— linkages. Bonding of the linker to the semiconductor surface is preferably via —O—Si— bonds. Alkyl linker groups can be fluoroalkyl groups including perfluorinated alkyl groups. Alternatively, the redox-active moiety can provided in a layer on the electrode surface. The layer of the surface may be a layer of polymer or plastic comprising the redox-active moiety. The redox-active moiety may be a multimer or polymer.

Materials of this invention include electrodes to which a redox-active moiety is adsorbed, complexed or bonded. Preferred electrodes are those in which the redox-active moiety is covalently bonded to the surface and preferably the redox-active moiety is bonded to the surface via a linker group which preferably may be an alkyl chain or fully or partially substitued alkyl chain wherein the substituents are not redox-active under the application conditions. Allyl linkers may for example, be substitued with one, two or more F's. Alternatively, the redox-active moiety can provided in a layer on the electrode surface. The layer of the electrode surface may be a layer of polymer or plastic comprising the redox-active moiety. The redox-active moiety may be a multimer or polymer.

Any redox-active moieites can be employed in the materials of this invention, however, ferrocenes, acridines, and quinones are preferred. The generic classes of redox-active moieties include derivatized ferrocenes, acridines and quinones that are substituted with groups that do not deterimentally affect redox-activity or general chemical stability of the moieties.

The redox-switchable materials of this invention can be a component of a reversible redox system which comprises a redox-switchable material in contact with an aqueous solution containing an oxidizing agent, such as oxygen, wherein the redox-active moiety in its oxidized state can be photoreduced upon irradiation of the semiconductor and in its reduced state can be oxidized by the oxidizing agent. In exemplary systems, oxygen is present during photoreduction of the redox-active moiety.

Redox-switchable materials of this invention can be employed in methods for selective removal, concentration or collections of one or mores selected solutes, most often charged species, from aqueous solutions. Cations or anions can selective removed, concentrated or collected. The removal of metal ions or of metal-containing cations from aqueous solution is a preferred application of the redox-switchable semiconductor materials and redox-switchable electrodes of this invention.

In a specific embodiment, counterions of the adsorbed, complexed or bonded redox-active moieties an be co-adsorbed, co-complexed or co-bonded to the semiconductor and/or electrode surfaces to decrease or neutralize surface charge.

The redox state of the redox-active materials can be electrically switched by attachment to an electrode so that its potential may be varied externally. Redox state may also be switched electrochemically by use of redox-active reagents. Finally, the surface may be switched by light by using a photoactive semiconductor as the support. On illumination with radiation of energy greater than the semiconductor's band gap, electron-hole pairs are generated near the surface of the semiconductor. These photogenerated holes and electrons are extremely effective "reagents" for carrying out oxidations and reductions, respectively. In particular, under the appropriate conditions one or both can cause redox reactions in surface-bound moieties.

The redox moieties may also "switch back" spontaneously under the appropriate conditions, for example through reaction with atmospheric oxygen. Such spontaneous switching is also of interest in a number of potential applications, as described below.

In systems in which switchable solute binding is driven by light. Elution of the adsorbed species will occur merely by changing the illumination. No additional reagents are required, and no new wastewater is generated. Instead, the adsorbed solutes can be concentrated into a smaller volume of solution. Light can be used to drive a redox-active system by using a semiconductor as the substrate. Absorption of photons having energy greater than the semiconductor's band gap generates electron-hole pairs, which are highly active "reagents" for causing redox reactions. The holes are powerful oxidizing agents, while the energetically promoted electrons are strong reducing agents.

In another embodiment, materials and methods for use in electrically-switched extraction of selected solutes from aqueous solutions are provided. Redox-switchable materials described herein can be employed to functionalize electrode surfaces to enhance efficiency of solute adsorption and/or release.

The materials herein can be employed for extraction and separation applications, in catalysis, in switchable extraction, particularly via photo-driven switching, in pollution control, water purification, desalination and hydrometallurgy. In addition, electrosorption by redox-active surfaces can employ such materials.

Switchable redox materials, including those of this invention, can be applied to the generation of reusable writing or data storage media for general information science applications, for storage of light energy in chemical forms, as in "artificial photosynthesis" for making fuel from solar energy, generally for making electrochromic materials, whose optical properties (e.g., color, reflectivity, transparency) change on application of an electric field; and in electrocatalysis which uses electricity to drive chemical reactions, e.g. to carry out more efficient syntheses of valuable products or to store electricity by making fuel.

The invention is further illustrated by the drawing, and the detailed description and examples that follow.

BRIEF DESCRIPTION OF THE DRAWINGS

FIG. 2 is a schematic illustration of improved electroadsorption method and apparatus. Electrode surfaces have "latchable" charges due to attached reversible redox species. Fc=ferrocene; $Fc^+$=ferricenium; $A^-$=tethered anionic group; $Cl^-$=solution chloride; $Na^+$=solution sodium.

DETAILED DESCRIPTION OF THE INVENTION

Figure 1:
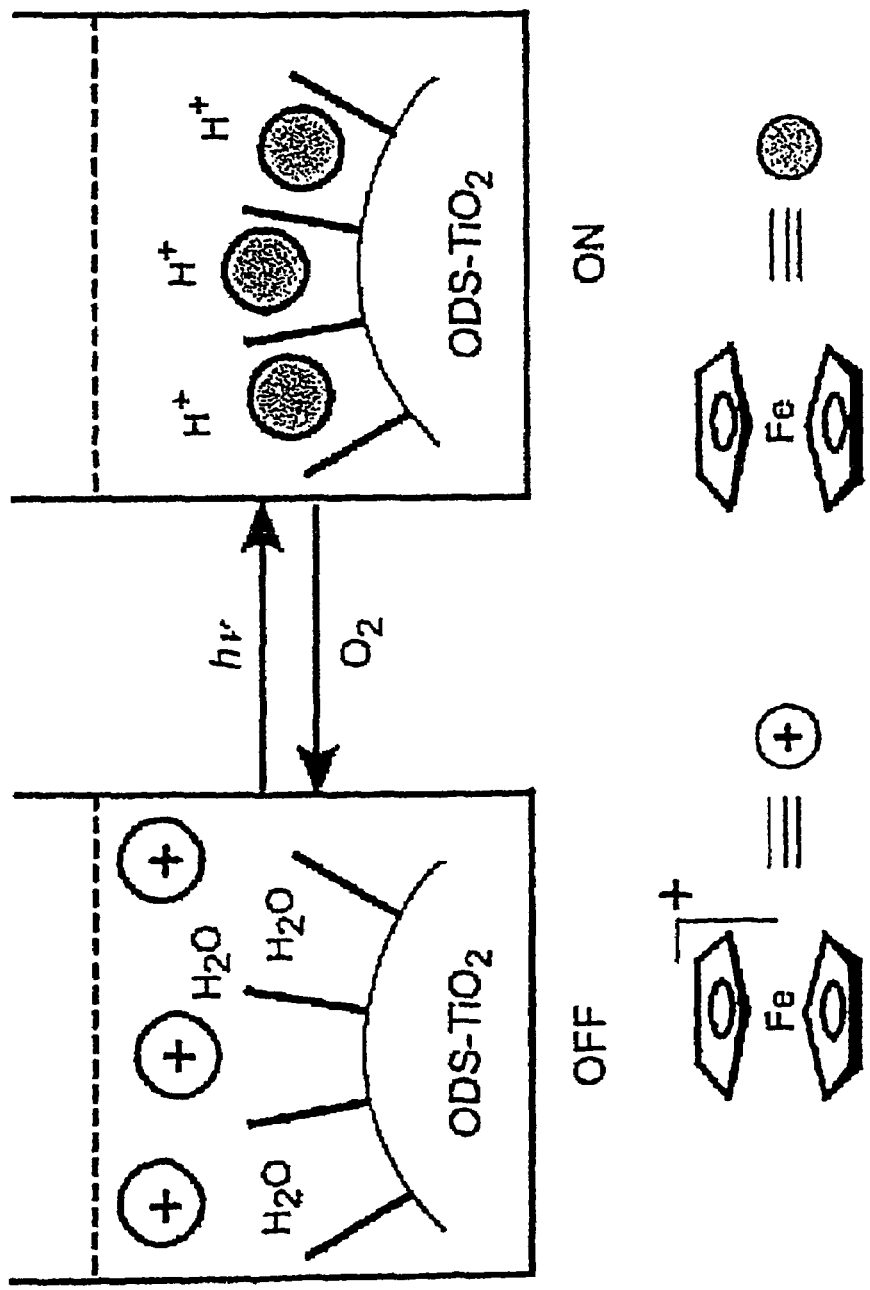
FIG. 1 is a schematic illustration of a self-reversing chemionic switch employing ODS-$TiO_2$, a hydrophobic semiconductor functionalized with octadecyltrichlorosilane). Holes generated by near-UV illumination of the semiconductor oxidize solvent ($H_2O$) to generate hydrogen ions ($H^+$), while photogenerated electrons reduce solution ferrocenium ($Fc^+$) to ferrocene (Fc). Fc dissolves into the hydrophobic layer on the semiconductor surface. After storing the system in the dark for several hours the ferrocene spontaneously reoxidizes by reaction with atmospheric $O_2$.

The present invention relates to materials which are redox-switchable. These materials comprise at least one redox-active species or moiety which is switchable between a reduced state and at least one oxidized state. A redox-active moiety or species contains one or more chemical functions or groups that can be reduced and oxidized, i.e. can accept electrons to be reduced and donate or transfer electrons to be oxidized. The term oxidation/reduction state of the redox-active moiety (or other materials or species) refers to whether the moiety is oxidized or reduced. For a given redox-active species there is a reduced state and at least one oxidized state and certain redox-active species may have more than one oxidized state, dependent upon the number of electrons transferred to achieve the oxidized state.

The redox-switchable materials of this invention may in addition function for adsorption, complexation or bonding to another chemical species. Most simply, the oxidation/reduction state of the redox-active moiety can facilitate adsorption of one or more chemical species to or desorption of one or more already adsorbed chemical species from the redox-switchable material. For example, the oxidation/reduction state of the redox-active moiety can result in a change in charged state (positive or negative) of the redox-switchable material which can facilitate adsorption or desorption of chemical species. More specifically, the oxidation/reduction state of the redox-active species can affect the charge state of surfaces of the redox-switchable material to affect adsorption of chemical species on those surfaces. In particular, the formation of positive or negative charge on a surface can decrease adsorption of a non-polar or hydrophobic species on the surface. A net decrease in charge on a surface can decrease adsorption of a polar or ionic species (of opposite charge) on a surface.

Alternatively or additionally, the materials of this invention may contain a selective complexation moiety which contains one or more chemical functions or groups that can complex, ligate, intercalate or otherwise bond to another chemical species. The term complexation is used generally for bonding or ligating through complexation, intercalation or other bonding (e.g., hydrogen bonding) to the chemical species and is preferably reversible. The complexation is preferably selective for a given chemical species or class of related chemical species, e.g., selective for a particular species size range, selective for a particular ion, etc. A selective complexation moiety can be a ligand, including a monodenate, bidentate, tridentate and other multidentate ligand and it may be a macrocycle, such as a crown ether, cryptand or related species. The redox-active moiety of this invention may also be a selective complexation moiety or the redox-active moiety may be covalently bonded to a selective complexation moiety. In specific embodiments, the oxidation/reduction state of the redox-moiety affects the complexation or binding affinity of the selective complexation moiety. For example, the selective complexation moiety may function for complexation to a given chemical species when the redox-active moiety is in one oxidation/reduction state and not function for complexation to that chemical species in another oxidation/reduction state.

The general term solute is used herein for a chemical species which can be selectively complexed to the selective complexation moiety from solution. Solutes include inorganic and organic anions, including various oxides and complex anions containing metal atoms, sulfur, phosphorous and/or halogen atoms and inorganic and organic cations, particularly metal cations and metal-containing cations. Solute anions and cations can include toxic or radioactive anions and cations which are beneficially removed to purify aqueous media. Solutes can also include non-ionic species which may be selectively.

In specific embodiments, a redox-active moiety of this invention is adsorbed to the surface of a solid material or within pores or channels of a solid material and can affect the charge state of the surface, pores or channels of that solid. The oxidation/reduction state of the adsorbed redox-active moiety can affect adsorption to the surface of the solid or into the pores or channels of the solid. In a specific example, the oxidation/reduction state of the adsorbed redox-active moiety affects its own adsorption on the solid, i.e., the redox-active moiety is adsorbed in one oxidation/reduction state and desorbed in another oxidation/reduction state. The solution environment with which the redox-switchable material is in contact may additionally affect the charged state of the surfaces, pores or channels of the solid and may affect adsorption on or in the surfaces, pores or channels.

In other specific embodiments, a redox-active moiety of this invention is covalently bonded to a surface (or within a pore of channel) of a solid and can affect the charge state of the surface, pores or channels of the solid. The oxidation/reduction state of the adsorbed redox-active moiety can affect adsorption to the surface of the solid or into the pores or channels of the solid.

In other specific embodiments, a redox-active moiety of this invention has a selective complexation function or is bonded to a selective complexation moiety and the redox-active moiety and any bonded selective complexation moiety is bonded to a solid material. The oxidation/reduction state of the bonded redox-active moiety affects selective complexation of the redox-active moiety or that of the selective complexation moiety.

In preferred embodiments the solid to which the redox-active moiety is adsorbed or bonded is a semiconductor material, particularly a photoactive semiconductor material, and more preferably is a oxide semiconductor material.

Semiconductor materials useful in this invention include photoactive semiconductors which generate electron-hole pairs on irradiation at appropriate wavelengths. Of particular use is titanium dioxide ($TiO_2$) and other oxide semiconductors including $V_2O_5$, ZnO, $SnO_2$, $Fe_2O_3$ (including $\alpha$-$Fe_2O_3$ and $\gamma$-$Fe_2O_3$) $In_2O_3$, $ZrO_2$, $WO_3$, $MoO_3$ and SiC (which is covered with a monolayer of $SiO_2$), and sulfide semiconductors such as ZS, CdS, or $MoS_2$. The semiconductor may also include mixed oxides such as ilmenites, FeTiO3, or spinels such as FeCrO4, or perovskites such as SrTiO3, or other mixed oxides such as pseudobrookites. vvSemiconductor materials may exist in different forms which exhibit more or less activity for the photoactivity, for example anatase $TiO_2$, is a preferred oxide semiconductor form.

Semiconductor materials may be doped with metal ions (e.g., Si, Al, Mg, V, Cr, Mn, Fe, Nb, Mo, W or Ru) introduced into their lattice to beneficially modify their properties, such as absorption or conductivity, for use in this invention. Semiconductors may have metal (transition metals, e.g., Cu or Ni, or other metals, e.g., Rh, Pd, Ag, Pt, Hg) deposited on their surfaces to beneficially modify their properties, such as absorption or conductivity, for use in this invention.

Semiconductors may be used in different physical forms, as particles, finely divided particles, or embedded, coated, layer or incorporated into other materials The semiconductor may be provided as a layer on a substrate, e.g., a non-semiconductor solid, such as glass, quartz, plastic or a solid polymer.

Semiconductors having high surface area are desirable which may be in the form of fine powders or of high-surface area solids.

In certain embodiments, hydrophobic semiconductor materials are employed. Hydrophobic semiconductor materials have an adsorbed, layered or bonded hydrophobic layer, particularly a hydrocarbyl (components containing only carbon and hydrogen) layer and more particularly a hydrocarbon, e.g., alkyl, layer.

Functionalization of the semiconductor surface may be carried out by noncovalent attachment, as with surfactants such as fatty acids, phosphonates, or sulfonates. Functionalization may also be carried out by covalent attachment using methods including, but not limited to, reactions of surface hydroxyl groups with chlorosilanes, alkoxysilanes, aminosilanes, or other functionalized silanes; or with reactions with metal carbonyls; or with photoactivated heterocyclic azides; or by other means. By use of different moieties on the functional groups the surface can be rendered hydrophobic (e.g., with alkyl moieties), or hydrophilic (e.g., with carboxylate, sulfonate, phosphonate, ammonium, or charged moieties), or otherwise be given useful properties.

In other embodiments the solids to which the redox-active materials are adsorbed or bonded are electrodes. Electrode materials include metals, semiconductors, oxide semiconductors, carbon (e.g., porous carbon and carbon aerogel electrodes).

Exemplary redox-active moieties are ferrocenes, acridines and quinones.

Various means are known in the art, as exemplified in references cited herein, for bonding redox-active moieties, such as ferrocene, to solid surfaces and particularly to oxide and sulfide semiconductors surfaces and to electrode surfaces.

The redox-switchable materials of this invention are switchable between oxidation/reduction states for example by irradiation with light of selected wavelength (irradiation of a photoactive semiconductor), electrically (employing electrodes), or chemical (use of oxidation or reduction agents).

The invention provides exemplary redox-switchable systems in which the redox-materials of this invention are operational contact with a source of electrons for reduction of the redox-active moiety or an electron acceptor to which electrons can be transferred to oxidize the redox-active moiety. The redox-switchable materials may be in contact with an electrode, or a photoactive semiconductor (with light source), and/or a chemical oxidizing agent or reducing agent. The redox-switchable materials may be in contact with an environment or a medium, such as a solution, particularly an aqueous solution, which provides or removes electrons, or contains one or more oxidizing or reducing agents. The redox-switchable materials may be in contact with a medium that provide oxygen for reoxidation of a redox-active moiety in its reduced state.

Several exemplary switchable, self-reversing systems based on photoredox reactions driven by semiconductor light absorption are described herein. The terms "self-reversing" is used for those systems in which an oxidizing agent or reducing agent present in the system functions to oxidize or reduce (i.e., to switch back) the redox-active material. The term is used in particular to refer to oxidation of the redox-active moiety by ambient oxygen present in the system after initial photo-induced reduction of the redox active moiety. The term "spontaneous" as applied to redox reaction herein refers to reaction which proceed without application of an external trigger, such as application of a voltage, irradiation with light, addition of one or more redox reagents, addition of an oxidizing agent, addition of a reducing agent. As used herein the term "spontaneous" reaction includes oxidation mediated by ambient oxygen levels in the system.

1. Self-Reversing Photodriven Systems: Adsorption of Redox-Active Solution Species a. Ferrocene and Hydrophobic Semiconductor.

Ferrocene(dicyclopentadienyliron(II), $(C_5H_5)_2Fe$, abbreviated Fc is well known to undergo reversible one-electron oxidation to the ferricenium cation, $Fc^+$. Irradiation of a solution of a ferricenium salt in a suspension of a hydrophobic semiconductor, such as TiO2 functionalized with octadecyltrichlorosilane as described below, causes quantitative reduction of the ferricenium to ferrocene, with a concomittant decrease in solution pH. Electron-hole pairs are generated in the semiconductor; the holes immediately oxidize solvent molecules:

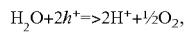

leaving the electrons available to reduce solution species:

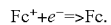

The overall stoichiometry is:

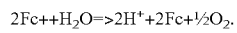

The change is strikingly apparent visually, as the initial ferricenium solution is blue while the suspended semiconductor particles are white. On illumination, the solution becomes colorless due to reduction of the ferricenium, while the semiconductor particles become yellow due to dissolution of the ferrocene into the hydrophobic surface layer. Ferrocene is extremely hydrophobic and thus is insoluble in water, and hence the hydrophobic layer on the semiconductor extracts it from aqueous solution. This reaction has been demonstrated both by measuring the drop in pH (according to the overall equation above) and by recovering the reduced ferrocene from the hydrophobic layer by solvent extraction.

The overall reaction is thermodynamically "uphill" and represents storage of some of the energy of the photons. Back-reaction of ferrocene with $O_2$ is very slow, however, in the absence of catalysts. One useful catalyst is $H^+$: if the solution is strongly acidic (~pH 0, e.g. 1 M HCl solution), the overall reaction spontaneously reverses over the course of a few hours, so long as the solution remains exposed to air (i.e., oxygen). Addition of a catalytic amount of an $Fe^{3+}$ salt, such as ferric chloride, to the solution catalyzes the back-reaction at an even higher pH. A variety of analogous catalysts can be used.

This system is a spontaneously reversing system. The forward (uphill) direction is driven by light, while the reversion occurs spontaneously, i.e., without an external trigger,—but not immediately—from reaction with atmospheric oxygen.

It was unexpectedly found that once the ferrocene has been reduced out of solution and incorporated into the hydrophobic layer of the semiconductor, the holes produced by continued illumination of the semiconductor did not oxidize this ferrocene. Our initial efforts were directed toward the use of photogenerated holes to oxidize ferrocene. Without wishing to be bound by any particular explanation, we believe, in hindsight, that the oxidizing potential of the holes generated by irradiation of the semiconductor is so different from that of ferrocene that there is little quantum mechanical overlap, and hence little tendency for reaction.

This system is describe in more detail in Muraoka, 2002 which is specifically incorporated by reference herein in its entirety for such detail. Supporting information that accompanies the journal article and which is available from the publisher is also incorporated by reference herein.

This system provides a chemionic switch, as illustrated in FIG. 1, involving reduction of ferricenium (off) to ferrocene (on) and reoxidiation to ferricenium with reduction driven by near-UV light and oxidation by atmospheric oxygen. This system can be readily implemented with other redox-active moieties, including acridines and quinones.

Exemplary Covalent Attachment of Hydrophobic Layer to Semiconductor

The semiconductor can be rendered hydrophobic in a number of ways. In the case of $TiO_2$, for example, a surface layer of alkyl chains can be covalently bonded by reaction with a hydrophobically substituted trichlorosilane, e.g., such as octadecyltrichlorosilane (ODS). The chlorine atoms react with hydroxyls on the $TiO_2$ surface to yield a covalent Ti—O—Si bond, while the chlorines between adjacent silicons are hydrolyzed to yield a network of 2-dimensional Si—O—Si links:

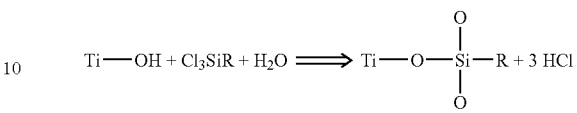

where R is a hydrophobic group (most generally a hydrocarbyl group containing only carbon and hydrogen, e.g., alkyl, alkenyl, alkynyl, or aryl groups, preferably hydrocarbyl groups having more than 6 carbon atoms and more preferably more than about 10 carbon atoms). The $TiO_2$ thus becomes coated with a "waxy" surface and is therefore strongly hydrophobic. This is shown during synthesis: the $TiO_2$ is first mixed with dry toluene and agitated in an ultrasonic bath, during which the particles tend to agglomerate and sink, due to the hydrophilic nature of the raw $TiO_2$ surface. After addition of ODS, however, the particles disperse in the nonpolar toluene, implying a change in the initial hydrophilic surface of the $TiO_2$. This hydrophobically functionalized $TiO_2$ is termed "ODS-TiO2".

Rendering oxide surfaces, including $TiO_2$, hydrophobic in this way has been described in the literature (e.g., Moses et al., 1978; Murray, 1980; Wang et al., 1998). We have also functionalized other oxide semiconductors such as $SnO_2$, $\alpha$-$Fe_2O_3$, $\gamma$-$Fe_2O_3$, $In_2O_3$, as well as and SiC (which is covered with a monolayer of $SiO_2$). $WO_3$ is not functionalizable in this way because of its extremely low pzc (<0.3), so that surface hydroxyls are not present. Other linking reagents, e.g., substituted cobalt carbonyls (Chen et al., 1992) or azides (Harmer, 1991) may also be used to establish covalent linkage of a hydrophobic surface moiety to a substrate. The listed references are incorporated by reference herein to provide specific example methods for generating hydrophobic semiconductor materials.

b. Adsorbed Anion Switching.

Large relatively hydrophobic anions such as $PF_6^-$ adsorb onto the ODS layer of the hydrophobic semiconductor. These anions are expelled, i.e., photodesorbed, by electrostatic repulsion on illumination of the semiconductor because of a build-up of negative charge. Such photodesorption can also occur with some anionic surfactants on the underivatized $TiO_2$ surface near its point-of-zero-charge (pzc). Large ions like $PF_6^-$ are proxies for toxic or radioactive ions such as radioactive $TcO_4^-$, whose removal from contaminated water is currently a matter of great interest, or for $Au(CN)_2^-$, which is basic to gold hydrometallurgy and ($ClO_4^-$), the removal of low levels of which from groundwater is also a matter of increasing interest. These large anions can be selectively photodesorbed from hydrophobic semiconductor materials, particularly oxide semiconductor materials, by irradiation of the semiconductor material to generate electron-hole pairs. Anions, particularly large anions having four or more atoms, can be selective removed from aqueous solutions by adsoprtion to a semiconductor material having a hydrophobic surface and removal of the semiconductor material carrying the adsorbed anions from the aqueous solution. Anions are release from the semiconductor material by irradiation of the semiconductor material in solution to generate negative charge on the semiconductor surface.

c. Adsorbed Cation Switching.

Under the appropriate circumstances, hydrophobic, e.g., organic, functionalization of the semiconductor is not necessary to exploit the photoinduced accumulation of electrons on the semiconductor surface. In aqueous solution, the surface of oxides such as $TiO_2$ is in general charged. There is an intermediate pH at which the number of positive and negative charges on the surface are equal, so that the overall surface charge is neutral. This pH is termed the "point of zero charge" (pzc). For $TiO_2$ pzc is at about pH 5.6. At pH lower than the pzc of the material, exposed oxide ions at the surface will take up protons to yield an overall surface positive charge, whereas at pH higher than the pzc, the surface is deprotonated to yield an anionic surface. Charged surfaces attract counterions of the appropriate charge by simple electrostatic attraction, and this establishes the well-known "double layer" of balancing charges at an electrolyte interface. Hence, at the proper pH UV irradiation of the semiconductor will change the charge of the surface so adsorbed species are desorbed due to simple electrostatic repulsion. Thus, charged species can be selectively adsorbed from the semiconductor by adjusting the pH to generate an appropriately charged surface (opposite in charge from that of the charged species to be adsorbed) and thereafter selectively desorbed by irradiation.

Moreover, literature review indicates that photoaccumulation of electrons on oxide semiconductors is a general phenomenon. Other oxides also have different pzcs and hence will adsorb differently at different pHs. Moreover, adsorption of particular solution species may be heightened, or decreased, by nanoscopic details of the oxide surfaces.

Additionally, certain oxide crystal structures have relatively open structures into which counterions can be intercalated. In particular, tungsten trioxide ($WO_3$) has a very open structure containing channels that can accommodate small ions such as $Li^+$. To maintain charge balance, some of the $W^{6+}$ in the crystal is reduced to $W^{5+}$ on $Li^+$ intercalation. A great deal of research has been done on electrochemical intercalation of $Li^+$ into $WO_3$ as a basis for electrochromic materials. In the case of $WO_3$, reduction of some $W^{6+}$ to $W^{5+}$, to maintain charge balance, places electrons into the conduction band where they become delocalized to yield typical metallic behavior. Hence the material changes from transparent to reflective. Photointercalation of $Li^+$ from organic solvents into $WO_3$ has also been demonstrated.

Therefore we are investigating whether $Li^+$ can be photo-extracted from aqueous solution onto $WO_3$. This would have an immediate application in hydrometallurgy, because lithium is extracted from natural brines in which it occurs at low concentrations against a background of much larger concentrations of common ions such as Na, K, and Mg. These larger cations, however, would not be expected to intercalate, and so such a system could have great selectivity for Li. Moreover, $WO_3$ exists in several polymorphs, with metastable polymorphs including much larger molecular-scale voids and channels having been synthesized only recently. To our knowledge these polymorphs have never been investigated for their photochemical and photointercalation properties.

$WO_3$ also has a much lower pzc, ~0.3, than $TiO_2$; hence its surface is anionic at all but the very lowest pHs. Finally, $WO_3$ like $TiO_2$ is nontoxic.

There are also a number of mixed transition-metal-containing oxides with very open structures, such as tungsten and titanium phosphates, that should be investigated. Like zeolites, these compounds contain channels and voids that can accommodate larger cations such as Na and Mg. So far as we have been able to determine, however, these compounds have not been investigated for their photoactivity. If they are capable of accumulating photogenerated electrons, they may be able to intercalate bigger cations, with obvious applications in desalination and purification.

2. Self-Reversing Photodriven Systems: Adsorbed Surface Species a. Photoswitching by Cation Adsorption/Surfactant Desorption Non-covalent attachment of hydrophobic molecules, e.g., by adsorption of surfactants such as oleic or other long-chain carboxylic acids (Drelich et al., 1998), hydroxamates (Folkers et al., 1995), hydroxylamines (Marabini & Rinelli, 1982) or phosphonates (e.g., Gao et al., 1996), can also be used to render a surface hydrophobic. We have demonstrated prototype switching of solute concentrations in semiconductor materials having surface adsorbed surfactants.

In the case of oleate ($CH_3(CH_2)_7CH$=$CH(CH_2)_7COO^-$), for example, the concentration of $Ca^{++}$ in the solution decreases on illumination of the semiconductor suspension. The photogenerated accumulation of electrons on the semiconductor surface causes desorption of oleate due to electrostatic repulsion. Oleate is then free to bind $Ca^{++}$, for which it is known to have a strong affinity (e.g., Matijevic et al., 1966). In addition, oleate binds strongly to $TiO_2$ at pHs in the vicinity of the pzc, where the surface charge should be most sensitive to photogenerated changes.

A portion of the observed decrease in Ca++ concentration in these experiments may also result because $Ca^{++}$ is free to couple electrostatically with bare (due to oleate desorption), negatively-charged $TiO_2$ surface. However, we have also prepared surfactant monolayers of N-hydroxyoctadecanamide (Folkers et al., 1995) and octadecylphosphonatic acid (Gao et al., 1996) on $TiO_2$ particles, and in these cases no change in $Ca^{++}$ was observed on illumination. This indicates that the affinity of the desorbed surfactant anion for the solute cation is an important factor in the results observed.

b. Photoswitching by Adsorbed Quinone Derivatives

Quinones are a well-known redox system in organic chemistry. Indeed, they are the basis of many biological electron-transfer reactions. Quinones readily and reversibly undergo reduction to the "hydroquinone" form:

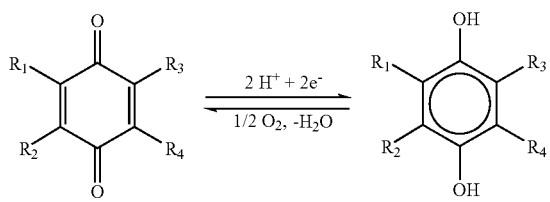

where the quinone and hydroquinone are on the left and right sides of the equation, respectively, and has the stoichiometry:

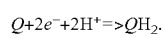

quinone (oxidized) hydroquinone (reduced)

In turn, hydroquinones are easily reoxidized to quinones. As shown above, commonly exposure to air is all that is required:

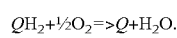

Many quinones are hydrophobic in both their reduced and oxidized forms and hence insoluble. Napthoquinones (e.g., 2), for example, are quite hydrophobic because of the fused aromatic ring. Such molecules adsorb readily to a hydrophobic surface, such as ODS-$TiO_2$, and so provide a simple way to functionalize the surface directly. Moreover, many substituted quinones are known to be good chelating agents for metal ions. Hence, redox switchable quinone derivatives may be able to reversibly bind solute ions from solution, depending on their redox state.

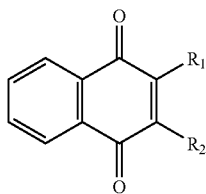

2

We have tested whether a series of naphthoquinone derivatives was oxidized by UV-light on ODS-$TiO_2$. In particular, 2-anilino-1,4-naphthoquinone (AnNQ; 3), in a

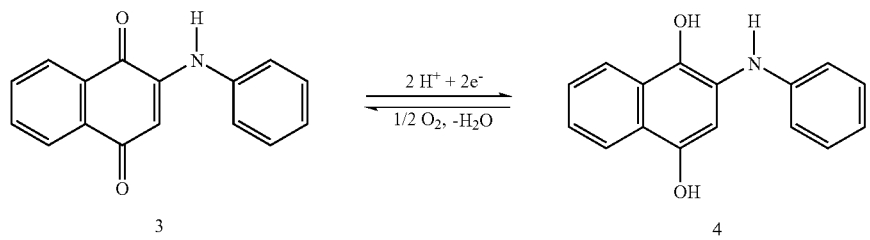

3  4 suspension of $TiO_2$-ODS, undergoes ready photoreduction to the hydroquinone (4) form on UV illumination (Table 1). The quinone form is a deep red-purple, whereas the hydroquinone form is white; this leads to a striking color change on illumination. In contrast to the ferrocene case, both forms are also insoluble in water, so they remain on the ODS layer atop the $TiO_2$. In the dark the white form reoxidizes with atmospheric $O_2$ over several hours, returning to the original red-purple color. Interestingly, this photoswitching does not occur in the presence of plain $TiO_2$, probably because of its hydrophilic nature.

Other quinones have been investigated and several respond similarly (Table 1), though they do not necessarily remain bound to the ODS-$TiO_2$ surface. Whether a given quinone can be photoreduced apparently depends both on thermodynamic factors (i.e., the quinone's reduction potential) and on kinetic factors, such as the ease of electron transfer from the underlying semiconductor.

Binding experiments with quinones: Since AnNQ has a carbonyl oxygen in proximity to a nitrogen, it was expected to bind metals; however, AnNQ binds to metals about equally well in both its oxidized and reduced forms. In contrast, quinolinoquinone (5), is known to bind metals in the oxidized, but not in the reduced form. It also undergoes photoswitching as indicated the results summarized in Table 1.

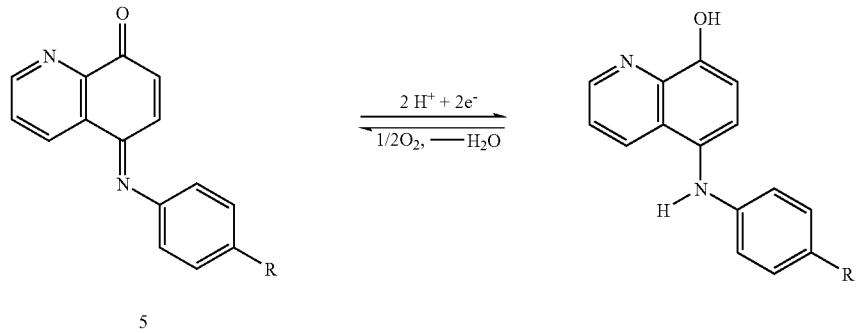

5

Additionally many dyes are quinone-based. Typically a dye is made "fast" by binding a metal ion, which changes it from the colorless "leuco" form (typically the hydroquinone) to the final insoluble colored form (the so-called "lake"), with oxidation occurring on metal binding. Hence the many quinones-based dyes which are known to bind metals can be employed as for switchable binding.

Photoswitching by Adsorbed Acridines

Substituted acridines 6 are known to undergo reversible redox reactions by addition of a proton opposite the nitrogen in the middle ring, with consequent loss of aromaticity in the middle ring and of the positive charge localized on the nitrogen:

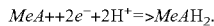

Thus, as with Fc-Fc$^+$, an oxidized cationic form is reduced to a neutral species. As with the naphthoquinones, however, both the reduced and oxidized forms are hydrophobic, and so can remain largely adsorbed to a hydrophobic substrate such as ODS-TiO$_2$.

We have demonstrated that this reduction can be driven photochemically with ODS-TiO$_2$, where R=a hydrocarbyl group or substituted hydrocarbyl wherein the substitution does not detrimentally affect the stability or redox properties of the molecule. Hydrocarbyl groups include alky (e.g., methyl, ethyl, propyl, butyl, etc.), alkenyl, alkynyl and aryl groups (e.g., phenyl). The hydrocarbyl may be substituted for example with one or more halogens, including F, Cl and or Br.

The change is again visible: the oxidized form is yellow whereas the reduced form is colorless. The reaction spontaneously reverses in the dark over several days.

b. Immobilization of Substituted Ferricenium

Photoreduction of Fc$^+$ out of aqueous solution into ODS-TiO$_2$ was described above. In an attempt to affix ferricenium to the TiO$_2$ surface, a substituted ferrocene was synthesized having an 18-carbon alkyl sidechain ("C$_{18}$Fc"). By making the whole molecule considerably more hydrophobic, even in the oxidized state, this indeed rendered the ferricenium form insoluble in water. Since the length of alkyl chain is same as that of hydrophobic layer on the ODS-TiO$_2$, C$_{18}$Fc could "interfinger" with that octadecyl chain by hydrophobic interaction to yield a surface functionalized with ferrocene. However, although neutral C$_{18}$Fc evidently binds to ODS-TiO$_2$, as evidenced by the ODS-TiO$_2$ particles acquiring a pale yellow tinge, this layer is apparently not ordered. Addition of benzoquinone yielded no color change, indicating that the Fc was not oxidized. Oxidation would not be expected to occur if on the average Fc groups were not exposed at the surface, as would happen if the C$_{18}$Fc layer formed a disordered tangle atop the ODS layer. However, if the C$_{18}$Fc was first oxidized to C$_{18}$Fc$^+$ with benzoquinone in acidic ethanolic solution, an ordered layer evidently forms on the ODS-TiO2. The ODS-TiO$_2$ changes to pale blue, indicating adsorption of the C18Fc, and it turns pale yellow when irradiated with UV light, indicating photoreduction of the surface ferrocenes.

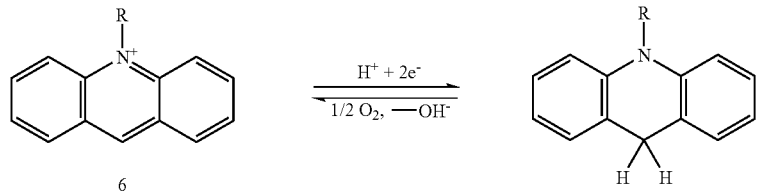

6

Substituted acridines have been widely studied as a model for the NAD-NADH enzyme system, which is a common biochemical redox mediator. As NAD is known to catalyze the oxidation of ferrocene, acridine is also potentially another catalyst for the ferrocene-based system.

Substituted acridines are also known to bind metals, and as such can be employed for redox-switchable metal binding.

Redox-active Species in Hydrophobic Layer

A number of experiments in which a hydrophobic redox-active species is immobilized in the hydrophobic layer atop the semiconductor by simple hydrophobic interaction have been carried out. These experiments include cases in which the layer is merely an adsorbed surfactant, as well as those in which it is covalently attached (e.g., as with ODS-TiO$_2$).

a. Ferrocene Cryptand.

Ferrocene cryptand (1) was immobilized in hydrophobic layers on TiO$_2$. These layers include the surfactants oleic acid, N-hydroxyoctadecanamide and octadecylphosphonic acid on TiO$_2$, as well as ODS-TiO$_2$. We initially thought that cation switching could be achieved through oxidation of the ferricenium moiety by the photogenerated holes. On oxidation the cation would be expelled through electrostatic repulsion. However, we have confirmed the counterintuitive result that the ferrocene cryptand is not oxidized by photogenerated holes, the holes react with the solvent instead. Switching of selective binding agents such as FcCrp can alternatively be achieved by photoreduction, so that take-up of cations would take place under illumination. Reoxidation by atmospheric O2 in the dark would then expel the cations.

Presumably when the C$_{18}$Fc is oxidized it acts as a surfactant, with a polar headgroup and hydrophobic tail. Such a configuration is much more likely to lead to a large degree of spontaneous organization than a completely hydrophobic molecule.

Unfortunately, the substituted ferrocene is also now considerably more difficult to oxidize with atmospheric O$_2$, probably because the now-adjacent cationic sites impose an additional electrostatic energy barrier. The increased hydrophobicity may also impose a kinetic barrier to electron transfer from the aqueous solution. However, catalysts can be employed to overcome this effect.

4. Covalent Tethering of Redox-Active Species to Semiconductor Surfaces

Redox-active surfaces can be generated by covalently binding the redox-active moieties onto the surfaces. Such surfaces are expected to be considerably more stable over a considerably wider range of chemical conditions (e.g., pH), than surfaces based on surfactant adsorption and/or hydrophobic interactions.

a. Covalent Attachment of Substituted Ferrocenes

Several methods of attaching ferrocenes to the semiconductor surface have been used. These methods were carried out in two steps: (1) covalent attachment of an organic moiety bearing a functional group to the semiconductor surface; and (2) linking a substituted ferrocene to that functional group.

Step (1) is merely analogous to the covalent binding of the hydrophobic layer to semiconductors as already described. Hydrolysis of a substituted silyl group establishes a covalent link to the semiconductor surface; however, instead of being an unsubstituted hydrocarbon, the "tail" off the surface now contains a functional group that can be further reacted to link another molecule. The term linker is used here for moiety that links redox-active moiety to a surface.

Aminopropyltriethoxysilane, $(EtO)_3Si(CH_2)_3NH_2$, and chloropropyltrimethoxysilane, $(MeO)_3Si(CH_2)_3Cl$ were employed as linkers. $TiO_2$ covalently modified with these molecules was prepared by heating under reflux in toluene (Hong et al., 1987; Bae et al., 2000). In the first case the semiconductor surface becomes functionalized with amide ($NH_2$) groups (14, Scheme 1); in the latter with a chlorinated hydrocarbon (15, Scheme 1).

Immobilization of Ferrocene Derivatives to Linker.

Four ferrocene derivatives, ferrocenylmethyl acetate (16) (Lindsay et al., 1957; Hayashi et al., 1980), ferrocenesulfonyl chloride (17) (Slocum & Achermann, 1982), 1-(hydroxymethyl)ferrocene (18) (Carlstrom & Frejd, 1990), and ferrocenylmethyl N,N'-dimethylethyldiamine (19) (Hayashi et al., 1980), were synthesized as described in the literature. The aminopropyl linker on $TiO_2$ was used to immobilize ferrocenylmethyl acetate (Hayashi et al., 1980) and ferrocenesulfonyl chloride (Hong et al., 1987), while the chloropropyl linker was used to immobilize 1-(hydroxymethyl)ferrocene (Bae et al., 2000), and ferrocenylmethyl N,N'-dimethylethylenediamine (Johnson et al., 1999), as shown in Scheme 1. In all cases, a color change of the $TiO_2$ powder from white to orange-brown indicated that the linking group on the $TiO_2$ reacted with the ferrocene derivatives.

In three cases, the tether from the ferrocene group to the semiconductor surface contains a secondary amine linkage (—C—NH—C—); in the fourth case it contains an ether link (—C—O—C—). These contrast to the Si—C and C—C links that are present in the ODS-$TiO_2$ surface functionalization. Data obtained using the ferrocene derivatized $TiO_2$ semiconductor materials indicate that ether and amine linkers are not photostable. Reaction with the photogenerated hole evidently cleaves these bonds, which means that the use of such linker is not practical. In contrast, linkers containing only carbon and hydrogens or Si—C bonds, particularly alkyl linkers which are bonded to the semiconductor surface by —O—Si— bonds, are more stable. Ferrocenes can be preferably linked to the semiconductor surface through with an alkyl chain. Compounds of the formula:

$(RO)_3Si(CH_2)_nFc$ wherein the alkyl linker is the —$(CH_2)_n$ chain and R is any appropriate group, particularly a small alkyl group or haloalkyl group, and is preferably that the alkyl linker chain have 6 or more carbon atoms (e.g., that n is 6 or more), and more preferably that the alkyl linker chain have 10 or more carbon atoms can reacted directly with the semiconductor surface in a single hydrolysis step. Scheme 2 illustrates the method.

The illustrated method can be employed for tethering of redox-active moieties other than ferrocenes, including acridines and quiones, among others.

Additionally, substituted alkyl linkers that are not photoreactive can also be employed, for example, linkers in which one, two, or more (including all) of the H of the $CH_2$ chain are replaced with F can be employed and methods analogous to those of Scheme 2 can be used with such substituted linkers.

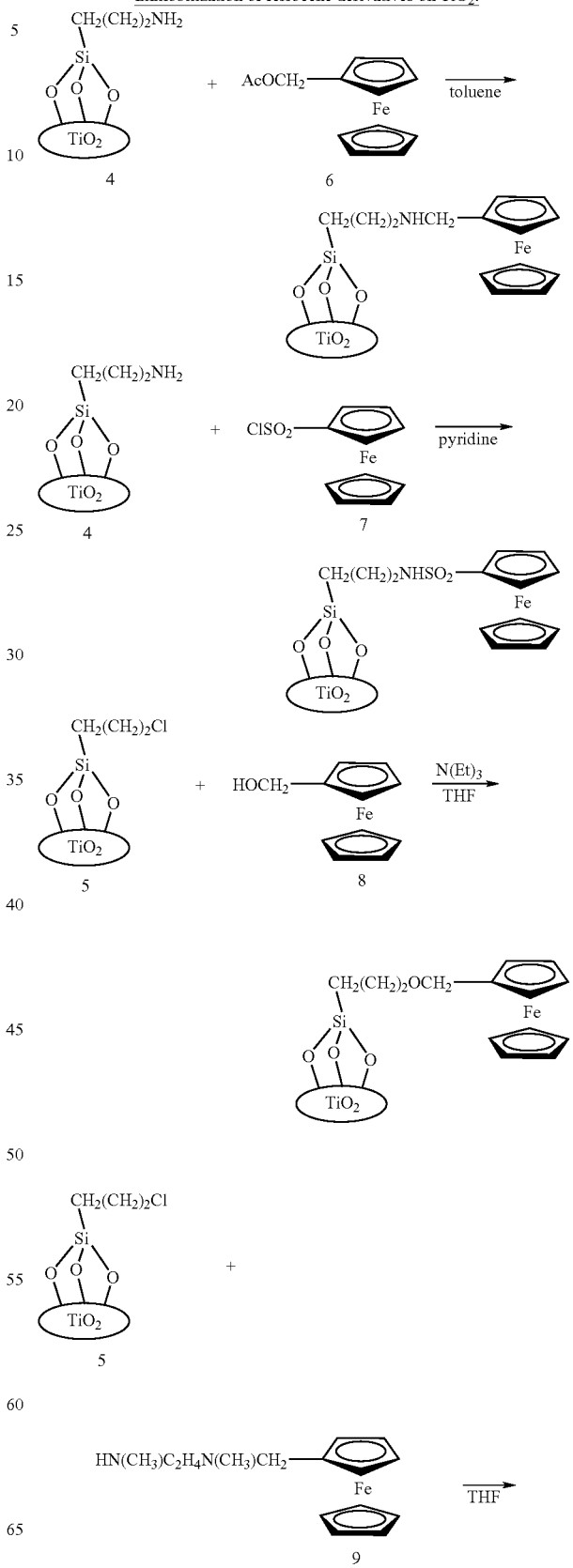

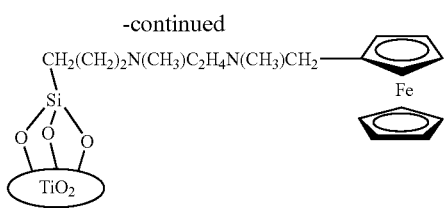

Scheme 2. Synthesis of silyl-functionalized ferrocene.

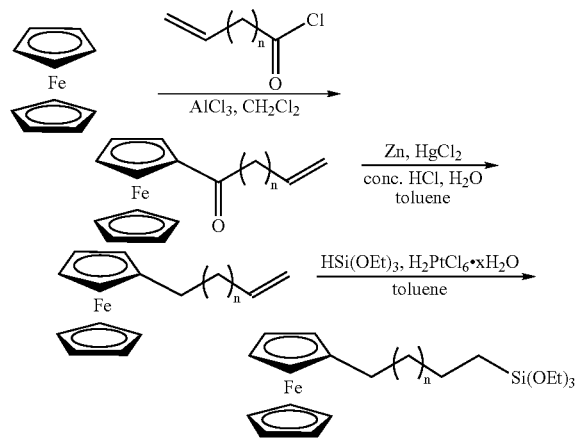

c. Co-immobilization with Compensating Charged Groups

The charge of a redox-active species is often opposite than desired. For extracting cations, for example, it would be optimal to have a switchable negatively charged surface, but ferrocene/ferricenium goes from neutral to positive.

One way to change the effective sign of a surface is to co-immobilize a counterion which is not redox active. Tethering the appropriate number of anionic groups such as sulfonate ($-SO_3^-$), carboxylate ($-CO_2^-$), or phosphonate ($-PO_3^=$) along with ferrocene, for example, would yield a surface with net neutral charge when in the ferricenium form, and with net negative charge when in the neutral ferrocene form.

Attaching a redox-active species like ferrocene and a compensating anionic group pairwise to a surface can be done as illustrated in structures 21 and 22:

Both alkyl tails of a long-chain carboxylic anhydride (21) are attached to the surface:

21

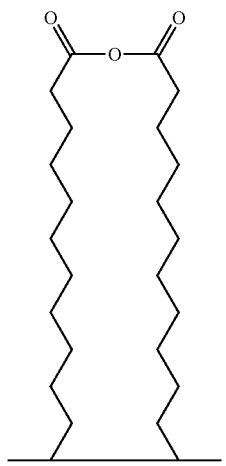

The anhydride linkage is then cleaved to attach ferrocene to one alkyl chain, while leaving a carboxylic acid group on the other (22):

22

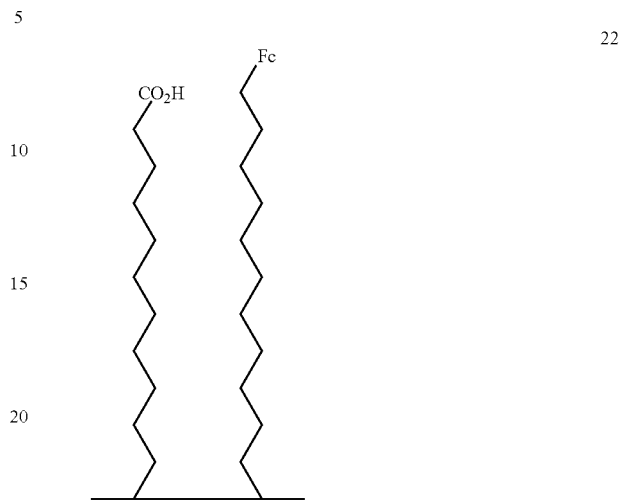

It is then straightforward to generate the carboxylate ($CO_2^-$)-ferricenium ($Fc^+$) ion pair. The carboxylate can be readily replaced with sulfonate.

Several of the exemplified systems constitute prototypes in which the switchable solute binding is driven by light, via irradiating of a semiconductor material In these cases, elution of an adsorbed species will occur merely by changing the illumination on the semiconductor material. No additional reagents are required, and no new wastewater is generated. Instead, the adsorbed solutes can be concentrated into a smaller volume of solution. Light can, for example, be used to drive a redox-active system by using a semiconductor as the substrate. Absorption of photons having energy greater than the semiconductor's band gap generates electron-hole pairs, which are highly active "reagents" for causing redox reactions. The holes are powerful oxidizing agents, while the energetically promoted electrons are strong reducing agents.

d. Electrosorption by Redox-active Surfaces.

Co-tethering a redox-active group and a compensating ion can be employed for electrosorption. While electrosorption has seemed a promising technique for water purification since the 1960s, but only recently have improvements in electrode materials made it appear practical (e.g., Farmer et al., 1996). The technique is elegantly simple in conception: charged electrodes attract dissolved ions out of water. When the electrodes are filled to capacity, they can then be regenerated merely by switching their polarity. Thus electrosorption constitutes an electrical approach to switchable absorption.

Although electrode surface areas and cycling lifetimes are much improved, electrosorption still suffers from problems with efficiency. One problem is leakage currents from the charged electrodes. Fundamentally, charging an electrosorbing electrode is analogous to charging a capacitor, as was pointed out over 30 years ago (Johnson & Newman, 1971). In the ideal situation, current will flow at a declining rate until the electrode is fully charged, at which point the current flow will cease. Analogously, once charged a perfect capacitor will remain charged indefinitely without the application of further current.

This analysis, however, assumes a so-called "perfectly polarizable electrode", which is capable of maintaining an arbitrary potential at an interface (in this case the water)

without current flow across it. Such electrodes represent an unattainable ideal. Real electrodes do transfer a certain amount of current across an aqueous interface, just as real capacitors cannot hold a charge indefinitely. Such "leakage currents" are a significant source of inefficiency in electrosorption, because maintaining the electrodes at a constant potential requires an ongoing expenditure of current. Moreover, the leakage currents worsen considerably as the water becomes more saline, because of the water's higher conductivity, and with the result that electrosorption is at present impractical for purifying more concentrated brines such as seawater.

One way to lessen leakage inefficiency would be to place fixed charges on the electrode surface. This is indeed how ion-exchange materials work; they contain surface charges (e.g., sulfonate groups) that attract ions of opposite charge from solution, and the charged groups on the surface are not free to move into the solution. Of course, such materials do not exhibit the switchable adsorption that is so potentially valuable for electroabsorption.

The leakage currents can be significantly decreased while maintaining the advantage of switchability by using redox-active electrode surfaces. Redox species present on the electrode surface provide a way to "latch" charge in place, with the result that leakage currents are greatly diminished. In effect, fixed charges are generated in place by the applied voltage. The electrode surface remains switchable, however, because reversing the potential reduces (or oxidizes) the redox species back to their original state. The only leakage losses occur during the charging or discharging of the electrode surface; no current is expended merely in maintaining the electrode potential.

For example, such a "latching" electrosorption system can be based on tethered ferrocene. Ferrocene groups are tethered to a first electrode, for example, a high-surface-area porous carbon electrode, covalently via alkyl chains or non-reactive substituted alkyl chains, so that the ferrocene can oxidized to ferricenium (and rereduced to ferrocene) by application of the proper potential to the electrode. This generates fixed positive charges on the electrode surface.

At the second electrode a ferricenium is co-tethered (as described above and illustrated in 21 and 22) with an equivalent amount of an anionic group, such as carboxylate ($CO_2^-$) or sulfonate ($SO_3^-$). This second electrode thus is also initially electrically neutral, because the positive charge on every ferricenium is compensated by an adjacent anionic group.

Electro-oxidation of the first electrode to ferricenium, which leaves that electrode positively charged, is accompanied by concomittant reduction of the ferricenium to ferrocene on the second electrode. This leaves the second electrode with a net negative charge, because the charge on the anionic groups is no longer compensated. At this point the charged groups on both electrodes can attract ions of compensating charge out of the solution, just as with the charged groups on an ion-exchange resin as illustrated in FIG. 2. However, this system remains switchable, just like a conventional electrosorption electrode: reversing the electrodes' polarities will reduce the ferricenium on the first electrode back to ferrocene while re-oxidizing the ferrocene on the second electrode to ferricenium. At this point the extracted ions are released.

Because the same redox species (ferrocene, is exemplified) is present on each electrode, the energy cost of switching should be minimal. Oxidation of a ferrocene (or reduction of ferricenium) on one electrode is simply compensated by a corresponding reduction or oxidation at the other electrode.

Moreover, just as in conventional electrosorption, much of the charging energy can be recovered on the discharge cycle, as the system acts like a high-capacity capacitor.

Redox-active electrode surfaces are known in the context of "pseudocapacitance", in which reduction or oxidation of species increases the effective charge capacity of the electrode. The phenomenon has attracted attention in the context of "supercapacitors", as it provides a way to greatly increase electric storage capacity (e.g., Conway et al., 1997). The phenomenon has not been proposed for application in electrosorption, however.

Other Applications: A material whose charge state can be "switched" by external triggers such as light, electricity, or chemical potential has a great number of potential applications that fall into several broad categories. As discussed above, switchable extraction, particularly via photo-driven switching, of solutes from solution (discussed above) is a major application of such materials using, among others for, pollution control, water purification, desalination and hydrometallurgy. In addition, electrosorption by redox-active surfaces can employ such materials.

Switchable redox materials, including those of this invention, can be applied to the generation of reusable writing or data storage media for general information science applications, for storage of light energy in chemical forms, as in "artificial photosynthesis" for making fuel from solar energy, generally for making electrochromic materials, whose optical properties (e.g., color, reflectivity, transparency) change on application of an electric field; and in electrocatalysis which uses electricity to drive chemical reactions, e.g. to carry out more efficient syntheses of valuable products or to store electricity by making fuel.

The explosive growth of computer usage has hardly led to a "paperless society". Because of the inconvenience of reading off a monitor screen, as contrasted with the printed page, computer text files are commonly printed out even when the material to be read is of an extremely ephemeral nature such as e-mail messages or current news. Such paper is usually discarded almost immediately, putting additional pressure on both disposal systems and forest resources. A printing medium that was as convenient as paper to read, but that could be reused repeatedly, would be very attractive both from the standpoint of economics and from that of minimizing ecological "footprint". "Paper" sheets that could be printed off a computer, but that could be erased (say) by intense light, or by standing in the dark for a few hours, or by application of an electric field, are obvious potential applications.

"Photochromic" materials change their color, or other optical properties, on exposure to light; "electrochromic" materials change these properties on application of an electric field. Both have been the subjects of intense interest for applications such as self-shading windows. Redox-activated surfaces suggest a new approach to these applications that may prove more practical.

"Artificial photosynthesis", the use of sunlight to produce fuel, has a literature stretching back to the early 1970s (e.g., Fukujima & Honda, 1972; Bard & Fox, 1995; Bolton, 1996) although it is not yet practical. Photo-driven switchable redox systems of this invention in which electron-hole pairs generated in illuminated semiconductors drive energetically "uphill" reactions, can be used to effectively store part of the energy of the photon into new chemical bonds. Several of the systems illustrated herein are "photosynthetic" in that the photoreduction of the oxidized species is energetically uphill. Hence some of the energy of the absorbed photon has been trapped into a chemical form. Furthermore, key issues in efficient photosynthesis by a semiconductor include efficient hole-pair separation, and minimum back-reaction between the chemical products formed. A recent paper (Gregg et al., 2001) has emphasized the importance of "kinetically inhibited" redox couples for minimizing back-reaction in practical photosynthetic systems. A number of self-reversing systems described herein exhibit slow but spontaneous reversal due to reaction with atmospheric oxygen after illumination is discontinued. In such cases the sluggishness of the back-reaction demonstrates a large kinetic barrier to reaction. In some cases a great difference in hydrophobicity between the reduced and oxidized forms imposes the kinetic barrier. Applications of such kinetically inhibited systems to solar energy storage is straightforward.

Switchable redox surfaces also are highly relevant to electrocatalysis, the use of electric potential to catalyze desired chemical reactions. They are particularly relevant to electrosynthesis, the use of electricity to drive chemical reactions in the thermodynamically uphill direction. A particularly important application of electrosynthesis in the coming years is likely to be the electrosynthesis of fuels, which would both furnish a way to store large amounts of electricity and to maintain supplies of fuel.

Those of ordinary skill in the art will appreciate that materials and methods other than those specifically exemplified herein are known in the art and can be employed in the practice of this invention without requiring undue experimentation. For example, redox-active species other than those specifically exemplified can be employed. Synthetic methods other than those specifically exemplified can be employed. The methods and materials of this invention can be applied for extraction and or separation of charged species other than those specifically identified. References cited above and listed below are intended in part to provide an overview of the state of the art and are incorporated by reference herein to the extent that they are not inconsistent with the teachings herein to provide additional description, illustration and examples of materials and methods that are known in the art and that can be employed in the practice of this invention.

acid functional group as anionic cap and their selective complexing abilities toward alkali metal cations, Perkin Trans. 1, 1995, pp. 2589-94.

Al'fimov, M. V.; Gromov, S. P.; Lednev, I. K.; Molecular design, photoisomerization and complexation of crown ether styryl dyes, Chem. Phys. Lett., 185, 1991, pp. 455-60.

Ameerunisha, Sardar; Zacharias, Panthappally S.; Characterization of simple photoresponsive systems and their applications to metal ion transport, Perkin Trans. 2, 1995, pp. 1679-82.

Anzai, Jun-ichi; Osa, Tetsuo; Photosensitive artificial membranes based on azobenzene and spirobenzopyran derivatives, Tetrahedron, 50, 1994, pp. 4039-70.

Aoyama, Masato; Watanabe, Jun; Inoue, Shohei; Photoregulation of permeability across a membrane from a graft copolymer containing a photoresponsive polypeptide branch, J. Am. Chem. Soc., 112, 1990, pp. 5542-5.

Bae, S. J.; Kim, S.-W.; Hyeon, T.; Kim, B. M.; *Chem. Commun.* (2000), 31.

Bard, A. J.; Fox, M. A.; Artificial Photosynthesis: Solar Splitting of Water to Hydrogen and Oxygen, Acc. Chem. Res., 28, 3, 141, 1995

Barrett, Geraldine; Corry, Denis; Creaven, B. S.; Johnston, B.; McKervey, M. A.; Rooney, Anthony; Anion- and solvent-dependent photochemical decomplexation of sodium salt complexes of a calix[4]arene tetraester, Chem. Commun., 1995, p. 363.

Betz, G.; Tributsch, H.; Energy conversion and storage using insertion materials, Prog. Solid State Chem., 16, 1985, pp. 195-290.

Betz, G.; Tributsch, H.; Fiechter, S.; Photointercalation and optical information storage using copper phosphide sulfide iodide (Cu6-xPS5I), J. Electrochem. Soc. 131, 1984, pp. 640-4.

Betz, G.; Tributsch, H.; Marchand, R.; Hydrogen insertion (intercalation) and light induced proton exchange at titanium dioxide (B)-electrodes, J. Appl. Electrochem., 14, 1984, pp. 315-22.

TABLE 1

Photoswitching of Exemplary Quinones

| Compound | Solvent[1] | Photoswitching[2] | Comments[3] |
|---|---|---|---|
| 2-anilino-1,4-naphthoquinone(2) | EtOH/$H_2O$ 9:1 | Bright orange ↔ pale yellow | Stays in solution |
|  | EtOH/$H_2O$ 2:8 | Pale purple ↔ purple | Stays on surface of ODS-$TiO_2$ |
|  | MeCN/$H_2O$ 9:1 | No | Untreated $TiO_2$ |
|  | EtOH/$H_2O$ 9:1 | No |  |
| 1,2-naphthoquinone-4-sulfonic acid, K salt | EtOH/$H_2O$ 1:9 | Yellow ↔ colorless | Stays in solution |
| (4'-dimethylaminophenylimino)quinolin-8-one (3) | EtOH/$H_2O$ 1:9 (pH 12) | Purple-blue ↔ pale brown | Stays on surface of ODS-$TiO_2$ |
|  | EtOH/$H_2O$ 1:9 (pH~6) | No |  |
| 1,2-naphthoquinone | EtOH/$H_2O$ 9:1 | Yellow → colorless only (No reversal) | Stays in solution |
| 4-amino-1,2-naphthoquinone hemihydrate | EtOH/$H_2O$ 9:1 | No | Stays in solution |
| 1,4-benzoquinone | EtOH/$H_2O$ 1:9 | No | Stays in solution |

[1]Volume ratios of solvent mixtures.
[2]The change in color on illumination is noted; the colors are separated by a double-headed arrow if photoswitching occurs (i.e., spontaneous reversal in the dark), a directed arrow i used if photoreduction occurs with no reversal.
[3]All experiments conducted in the presence of ODS-$TiO_2$ unless "untreated $TiO_2$" is noted; The phrase "stays in solution" indicates that the compound (and its reduced form) do no absorb to the $TiO_2$

REFERENCES

Akabori, Sadatoshi; Miura, Yoshikaza; Yotsumoto, Noriko; Uchida, Kiyoshi; Kitano, Masaru; Habata, Yoichi; Synthesis of photoresponsive crown ethers having a phosphoric Blank, M.; Soo, L. M.; Wassermann, N. H.; Erlanger, B. F.; Photoregulated ion binding, Science, 214, 1981, pp. 70-2.

Bocarsly, Andrew B.; Walton, Erick G.; Wrighton, Mark S.; Use of chemically derivatized n-type silicon photoelectrodes in aqueous media Photooxidation of iodide, hexacyanoiron(II), and hexaammineruthenium(II) at ferrocene-derivatized photoanodes, J. Am. Chem. Soc., 102, 1980, pp. 3390-8.

Bolton, James R.; Solar photoproduction of hydrogen: A review, Sol. Energy (1996), 57(1), 37-50.

Bolts, Jeffrey M.; Wrighton, Mark S.; Chemically derivatized n-type semiconducting germanium photoelectrodes. Persistent attachment and photoelectrochemical activity of ferrocene derivatives, J. Am. Chem. Soc., 100, 1978, pp. 5257-62

Bolts, Jeffrey M.; Wrighton, Mark S.; Chemically derivatized n-type semiconducting gallium arsenide photoelectrodes. Thermodynamically uphill oxidation of surface-attached ferrocene centers, J. Am. Chem. Soc., 101, 1979, pp. 6179-84

Bolts, Jeffrey M.; Bocarsly, Andrew B.; Palazzotto, Michael C.; Walton, Erick G.; Lewis, Nathan S.; Wrighton, Mark S.; Chemically derivatized n-type silicon photoelectrodes. Stabilization to surface corrosion in aqueous electrolyte solutions and mediation of oxidation reactions by surface-attached electroactive ferrocene reagents, J. Am. Chem. Soc., 101, 1979, pp. 1378-85.

Borgarello, E.; Harris, R.; Serpone, N.; Photochemical deposition and photorecovery of gold using semiconductor dispersions. A practical application of photocatalysis, Nouv. J. Chim., 9, 743-7, 1985;

Borgarello, Enrico; Serpone, Nick; Emo, Gary; Harris, Ron; Pelizzetti, Ezio; Minero, Claudio; Light-induced reduction of rhodium(III) and palladium(II) on titanium dioxide dispersions and the selective photochemical separation and recovery of gold(III), platinum(IV), and rhodium(III) in chloride media, Inorg. Chem., 25 (25), 1986, pp. 4499-503;

Brown, J. D.; Williamson, D. L.; Nozik, A. J.; Moessbauer study of the kinetics of iron(3+) photoreduction on titanium dioxide semiconductor powders, J. Phys. Chem., 89 (14), 1985, pp. 3076-80.

Brown, G. T.; Darwent, J. R.; Photoreduction of Methyl Orange sensitized by colloidal titanium dioxide, Farad. Trans. I, 80, 1631-1643, 1984.

Carlstrom, A.-S.; Frejd, T. J. Org. Chem., 1990, 55, 4175-4180.

Chambliss, C. Kevin; Odom, Matthew A.; Martin, Charles R.; Moyer, Bruce A.; Strauss, Steven H.; Rapid and selective redox-recyclable anion-exchange materials containing polyalkylated ferrocenium anion-exchange sites, Inorg. Chem. Commun. 1, 1998, 435-438.

Chen, Kaimin; Herr, Brian R.; Singewald, Elizabeth T.; Mirkin, Chad A.; Cobalt-mediated modification of oxide surfaces with redox-active molecules, Langmuir (1992), 8(11), 2585-7.

Chenthamarakshan, C. R.; Yang, H.; Savage, C. R.; Rajeshwar, K.; Photocatalytic reactions of divalent lead ions in UV-irradiated titania suspensions, Res. Chem. Intermed. (1999), 25(9), 861-876.

Clark, Jennifer F.; Chamberlin, Rebecca M.; Abney, Kent D.; Strauss, Steven H.; Design and use of redox-recyclable organometallic extractants for the cationic radionuclides 137Cs+ and 90Sr2+ from waste solutions, Environ. Sci. Technol., 33, 1999, pp. 2489 ff.

Clark, J. F.; Clark, D. L.; Whitener, G. D.; Schroeder, N. C.; Strauss, S. H.; Isolation of soluble 99Tc as a compact solid using a recyclable, redox-active, metal-complex extractant, Environ. Sci. Technol., 30, 1996, pp. 3124 ff.

Conway, B. E.; Birss, V.; Wojtowicz, J.; The role and utilization of pseudocapacitance for energy storage by supercapacitors, J. Power Sources (1997), 66(1-2), 1-14.

Curran, J. S.; Domenech, J.; Jaffrezic-Renault, N.; Philippe, R.; Kinetics and mechanism of platinum deposition by photoelectrolysis in illuminated suspensions of semiconducting titanium dioxide, J. Phys. Chem., 89 (6), 1985, pp. 957-63.

Drelich, J; Lu, Y; Chen, L; Miller, J D; Guruswamy, S; FTIR internal reflection spectroscopy studies of the effect of pH on adsorption of oleate/oleic acid at the surface of a TiO2 thin film deposited on a Ge single crystal, Appl. Surf. Sci. (1998), 125(2), 236.

Effing, Jochem J.; Kwak, Jan C. T.; Photoswitchable phase separation in hydrophobically modified polyacrylamide/surfactant systems, Angew. Chem., Int. Ed. Engl., 34, 1995, pp. 88-90.

Eliet, Veronique; Bidoglio, Giovanni; Kinetics of the Laser-Induced Photoreduction of U(VI) in Aqueous Suspensions of TiO2 Particles, Environ. Sci. Technol. (1998), 32(20), 3155-3161.

Farmer, Joseph C.; Fix, David V.; Mack, Gregory V.; Pekala, Richard W.; Poco, John F.; Capacitive deionization of NaCl and NaNO3 aqueous solutions with carbon aerogel electrodes, J. Electrochem. Soc. (1996), 143, 159-69.

Folkers, John P.; Gorman, Christopher B.; Laibinis, Paul E.; Buchholz, Stefan; Whitesides, George M.; Nuzzo, Ralph G.; Self-Assembled Monolayers of Long-Chain Hydroxamic Acids on the Native Oxide of Metals, Langmuir, 11 (3), 1995, pp. 813-24.

Foster, Nancy S.; Noble, Richard D.; Koval, Carl A.; Reversible photoreductive deposition and oxidative dissolution of copper ions in titanium dioxide aqueous suspensions, Environmental science & technology, 27, 2, Feb. 1993, pp. 350.

Foster, Nancy S.; Koval, Carl A.; Noble, Richard D.; Reversible photodeposition and dissolution of metal ions; U.S. Pat. No. 5,332,508

Foster, Nancy S.; Lancaster, Alice N.; Noble, Richard D.; Koval, Carl A.; Effect of Organics on the Photodeposition of Copper in Titanium Dioxide Aqueous Suspensions, Ind. Eng. Chem. Res. (1995), 34(11), 3865-71.

Feringa, Ben L.; Jager, Wolter F.; de Lange, Ben; Organic materials for reversible optical data storage, Tetrahedron, 49, 1993, pp. 8267-310.

Fuerstner, A.; Sedidel, G.; Kopiseke, C.; Krueger, C.; Mynott, R.; Syntheses, structures, and complexation properties of photoresponsive crownophanes, Liebigs Ann., 1996, pp. 655-662.

Fujinami, Tatsuo; Kawahara, Nobuo; Sakai, Shizuyoshi; Ogita, Masami; Ionic conductivity induced by photooxidation of ferrocene in polymer film containing organotin compound, Chem. Lett., 1993, pp. 585-8

Fujishima, A.; Honda, K.; Electrochemical photolysis of water at a semiconductor electrode, Nature, 238, 37, 1972

Gao, Wei; Dickinson, Lucy; Grozinger, Christina; Morin, Frederick G.; Reven, Linda; Self-Assembled Monolayers of Alkylphosphonic Acids on Metal Oxides, Langmuir, 12 (26), 1996, 6429-6435

Gopidas, K. R.; Kamat, Prashant V.; Photoelectrochemistry in particulate systems. 11. Reduction of phenosafranin dye in colloidal titanium dioxide and cadmium sulfide suspensions, Langmuir, 5 (1), 1989, pp. 22-6.

Gregg, Brian A.; Pichot, Francois; Ferrere, Suzanne; Fields, Clark L.; Interfacial Recombination Processes in Dye-Sensitized Solar Cells and Methods To Passivate the Interfaces, J. Phys. Chem. B (2001), 105(7), 1422-1429.

Gronet, Chris M.; Lewis, Nathan S.; Cogan, George; Gibbons, James; Photoelectrochemistry of n-type silicon in methanol: design of a 10.1% efficient semiconductor/liquid junction solar cell, Proc. Natl. Acad. Sci. U.S.A., 80, 1983, pp. 1152-6.

Hankins, Matthew G.; Hayashita, Takashi; Kasprzyk, Stanislaw P.; Bartsch, Richard A.; Immobilization of Crown Ether Carboxylic Acids on Silica Gel and Their Use in Column Concentration of Alkali Metal Cations from Dilute Aqueous Solutions, Anal. Chem., 68 (17), 1996, pp. 2811-2817

Harmer, Mark A.; Photomodification of surfaces using heterocyclic azides, Langmuir (1991), 7(10), 2010-12.

Hauenstein, D. E.; Rethwisch, D. G.; Photocontrol of gas separation properties, Sep. Sci. Tech., 25, 1990, pp. 1441 ff.

Hayashi, T.; Mise, T.; Fukushima, M.; Kagotani, M.; Nagashima, N.; Hamada, Y.; Matsumoto, A.; Kawakami, S.; Konishi, M.; Yamamoto, K.; Kumada, M. Bull. Chem. Soc. Jpn., 1980, 53, 1138-1151.

Herrmann, Jean Marie; Disdier, Jean; Pichat, Pierre; Photocatalytic deposition of silver on powder titania: consequences for the recovery of silver, J. Catal., 113 (1), 1988, pp. 72-81.

Hong, A. P.; Bahnemann, D. W.; Hoffmann, M. R. Cobalt(II) tetrasulfophthalocyanine on titanium dioxide: A new efficient electron relay for the photocatalytic formation and depletion of hydrogen peroxide in aqueous suspension, J. Phys. Chem., 1987, 91, 2109.

Irie, Masahiro; Kato, Masatoshi; Photoresponsive molecular tweezers. Photoregulated ion capture and release using thioindigo derivatives having ethylenedioxy side groups, J. Am. Chem. Soc., 107, 1985, pp. 1024-8

Izatt, R. M.; Bruening, R. L.; Borup, M. B.; Heavy metal removal using bound macrocycles, Water Sci. Technol., 23 (1-3), 1991, pp. 301-8

Izatt, R. M.; Bradshaw, J. S.; Bruening, R. L.; Selective separation using supported devices, in D. N. Reinhoudt, ed., Comprehensive Supramolecular Chem., vol. X, Pergamon, 1996, ch. 1, pp. 1-11

Jacobs, J. W. M.; Kampers, F. W. N.; Rikken, J. M. G.; Blue-Lieuwma, C. W. T.; Koningsberger, D. C.; Copper photodeposition on TiO2 studied with HREM and EXAFS, J. Electrochem. Soc., 136, 2914, 1989.

Johnson, B. F. G.; Raynor, S. A.; Shephard, D. S.; Mashmeyer, T.; Thomas, J. M.; Sankar, G.; Bromley, S.; Oldroyd, R.; Gladden, L.; Mantle, M. D. Chem. Commun. 1999, 1167.

Johnson, S.; Newman, J.; Desalting by means of porous carbon electrodes, J. Electrochem. Soc. (1971), 118, 510-17.

Kano, Koji; Tanaka, Yasuhiko; Ogawa, Teiichiro; Shimoura, Masatsugu; Okahata, Yoshio; Kunitake, Toyoki; Photoresponsive membranes. Regulation of membrane properties by photoreversible cis-trans isomerization of azobenzenes, Chem. Lett., 1980, pp. 421-4

Kanoh, Hirofumi; Ooi, Kenta; Miyai, Yoshitaka; Katoh, Shunsaku; Method and electrode for electrochemical recovery of lithium values from aqueous solution, U.S. Pat. No. 5,198,081.

Kanoh, H.; Ooi, K.; Miyai, Y.; Katoh, S.; Electrochemical recovery of lithium ions in the aqueous phase, Sep. Sci. Technol., 28, 1993b, pp. 643 ff.

Kashiwagi, Yoshitomo; Pan, Qinghai; Kurashima, Futoshi; Kikuchi, Chikara; Anzai, Jun-Ichi; Osa, Tetsuo; Construction of a complete bioelectrocatalytic electrode composed of alcohol dehydrogenase- and all electron-transfer components-modified graphite felt for diol oxidation, Chem. Lett., (2), 1998, pp. 143-144.

Kimura, keiichi; Mitzutani, R.; Yokoyama, M. Arakawa, R.; Matsubayashi, G; Okamoto, M. Doe, H.; All- or none type photochemical switching of cation binding with malachite green carrying a bis(monoazacrown ether) moiety, J. Am. Chem. Soc., 119, 1997, pp. 2062-2063.

Kimura, K; Photocontrol of ionic-conduction by photochromic crown-ethers, Coord. Chem. Rev., 148, 1996, pp. 41-61

Kimura, Keiichi; Kaneshige, Masayuki; Yamashita, Takashi; Yokoyama, Masaaki; Cation complexation, photochromism, and reversible ion-conducting control of crowned spironaphthoxazine, J. Org. Chem., 59, 1994, pp. 1251-6.

Kumano, Atsushi; Niwa, Osamu; Kajiyama, Tisato; Takayanagi, Motowo; Kano, Koji; Shinkai, Seiji, Photoinduced ion permeation through a ternary composite membrane composed of polymer/liquid crystal/azobenzene-bridged crown ether, Chem. Lett., 1983, pp. 1327-30

Legg, K. D.; Ellis, A. B.; Bolts, J. M.; Wrighton, M. S.; n-Type Si-based photoelectrochemical cell: New liquid junction photocell using a nonaqueous ferricenium/ferrocene electrolyte, Proc. Natl. Acad. Sci. USA, 74, 1977, pp. 4116-4120.

Lilga, M. A.; Orth, R. J.; Sukamto, J. P. H.; Haight, S. M.; Schwartz, D. T.; Metal ion separations using electrically switched ion exchange, Sep. Purif. Technol., 11, 1999, pp. 147 ff.

Lindsay, J. K.; Hauser, C. R. J. Org. Chem., 1957, 22, 355-358.

Marabini, A. M.; Rinelli, G.; Development of a specific reagent for rutile flotation, Trans. AIME, 274, 1822-1827, 1982.

Marquis, Damien; Henze, Bjorn; Bouas-Laurent, Henri; Desvergne, Jean Pierre; Synthesis and cation complexing properties of a new type of photoactive coronands. Towards photocontrol of Na+ complexation, Tetrahedron Lett., 39, 1998, pp. 35-38

Martin, Monique M; Plaza, Pascal; Meyer, Yves H; Badaoui, Fatima; Bourson, Jean; Lefevre, Jean-Pierre; Valeur, Bernard; Steady-state and picosecond spectroscopy of li+ or ca2+ complexes with a crowned merocyanine. Reversible photorelease of cations, J. Phys. Chem., 100, 1996, pp. 6879-6888

Moses, P. R.; Wier, L. M.; Lennox, J. C.; Finklea, H. O.; Lenhard, J. R.; Murray, R. W.; X-ray photoelectron spectroscopy of alkylaminesilanes bound to metal oxide electrodes, Anal. Chem., 50 (4), 1978, pp. 576-85

Muraoka, M.; Gillett, S. L.; Bell, T. W.; Reversible Photoinsertion of Ferrocene into a Hydrophobic Semiconductor Surface: A Chemionic Switch; Angew. Chemie Int. Ed.; 2002; 41(19):3653-3655

Murray, Royce W.; Alkylamine silanes bound to metal oxide electrodes, in Silylated Surfaces, pp. 125-35; Donald E. Leyden and Ward T. Collins, eds.; New York: Gordon and Breach Science Publishers, 1980; Midland Macromolecular Monograph, 7.

Okahata, Yoshio; Lim, Han Jin; Hachiya, Satoshi; Bilayer coated capsule membranes. Part 2. Photoresponsive permeability control of sodium chloride across a capsule membrane, Perkin Trans. 2, 1984, pp. 989-94

Serpone, N.; Borgarello, E.; Barbeni, M.; Pelizzetti, E.; Pichat, P.; Hermann, J.-M.; Fox, M. A.; Photochemical reduction of gold(III) on semiconductor dispersions of TiO2 in the presence of CN— ions: disposal of CN— by treatment with hydrogen peroxide, J. Photochem, 36, 373-388, 1987.

Saji, T.; Kinoshita, I.; Electrochemical ion transport with ferrocene functionalized crown ether, Chem. Commun., 1986, pp. 716-717.

Schultz, Jerome S.; Carrier-mediated photodiffusion membranes, Science, 197, 1977, pp. 1177-9

Shinkai, Seiji; Switchable guest-binding receptor molecules, in G. Gokel, ed., Comprehensive Supramolecular Chemistry, vol. I, Pergamon, 1996, ch. 18, pp. 671-700.

Shinkai, Seiji; Miyazaki, Kiminori; Manabe, Osamu; Photoresponsive crown ethers. Part 18. Photochemically switched-on crown ethers containing an intra-annular azo substituent and their application to membrane transport, Perkin Trans. 1, 1987, pp. 449-56

Shinkai, Seiji; Minami, Takahide; Kusano, Yumiko; Manabe, Osamu; Photoresponsive crown ethers. 8. Azobenzenophane-type switched-on crown ethers which exhibit an all-or-nothing change in ion-binding ability, J. Am. Chem. Soc., 105, 1983, pp. 1851-6

Shinkai, Seiji; Shigematsu, Kazuyoshi; Kusano, Yumiko; Manabe, Osamu; Photoresponsive crown ethers. Part 3. Photocontrol of ion extraction and ion transport by several photofunctional bis(crown ethers), Perkin Trans. 1, 1981, pp. 3279-83

Shinkai, Seiji; Shigematsu, Kazuyoshi; Sato, Michiko; Manabe, Osamu; Photoresponsive crown ethers. Part 6. Ion transport mediated by photoinduced cis-trans interconversion of azobis(benzocrown ethers), Perkin Trans. 1, 1982, pp. 2735-9

Shinkai, Seiji; Minami, Takahide; Kusano, Yumiko; Manabe, Osamu; A new "switched-on" crown ether which exhibits a reversible all-or-none ion- binding ability, Tetrahedron Lett., 23, 1982, pp. 2581-4.

Slocum, D. W.; Achermann, W. Synth. React. Inorg. Met. -Org. Chem., 1982, 12, 397-405.

Stauffer, Mark T.; Knowles, David B.; Brennan, Carrie; Funderburk, Lance; Lin, Fu-Tyan; Weber, Stephen G.; Optical control over Pb2+ binding to a crown ether-containing chromene, Chem. Commun., 1997, pp. 287-288

Strauss, Steven H.; Redox-recyclable extraction and recovery of heavy metal ions and radionuclides from aqueous media, ACS Symp. Ser., 716 (Metal-Ion Separation and Preconcentration), 1999, pp. 156-165.

Takeshita, Michinori; Irie, Masahiro; Photoresponsive cesium ion tweezers with a photochromic dithienylethene, Tetrahedron Lett., 39, 1998, pp. 613-616.

Tanaka, K.; Harada, K.; Murata, S.; Photocatalytic deposition of metal ions onto TiO2 powder, Solar Energy, 36, 159, 1986.

Tatistcheff, Helen B.; Hancock, Lawrence F.; Wrighton, Mark S.; Charge-transfer-to-solvent photochemistry of electrode-confined ferrocene- and cobaltocene-based polymers: Photoelectrochemical reduction of halocarbons, J. Phys. Chem., 99, 1995, pp. 7689-93

Tendero, M. J. L.; Benio, A.; Martinez-Manez, R.; Soto, J.; Paya, J. Edwards, A. J.; Raithby, P. R.; Tuning of the electrochemical recognition of substrates as a function of the proton concentration in solution using pH-responsive redox-active receptor molecules, Dalton Trans., 1996, pp. 343 ff.

Tributsch, H.; Photo-intercalation: possible application in solar energy devices, Appl. Phys., 23, 1980, pp. 61-71.

Tributsch, Helmut; Photoelectrochemical studies on intercalation and semiconducting intercalation compounds, Solid State Ionics, 9-10, 1983, pp. 41-57.

Tsivgoulis, Gerasimos M.; Lehn, Jean-Marie; Photonic molecular devices: reversibly photoswitchable fluorophores for nondestructive readout for optical memory, Angew. Chem., Int. Ed. Engl., 34, 1995, pp. 1119-22.

Tucker, James H. R.; Bouas-Laurent, Henri; Marsau, Pierre; Riley, Stuart W.; Desvergne, Jean-Pierre; A novel crown ether-cryptand photoswitch, Chem. Commun., 1997, pp. 1165-6.

Vinodgopal, K.; Bedja, Idriss; Hotchandani, Surat; Kamat, Prashant V.; A Photocatalytic Approach for the Reductive Decolorization of Textile Azo Dyes in Colloidal Semiconductor Suspensions, Langmuir, 10 (6), 1994, pp. 1767-71.

Wang, Yuhu; Supothina, Sitthisuntorn; Guire, Mark R De; Heuer, Arthur H; Collins, Rochael; Sukenik, Chaim N; Deposition of Compact Hydrous Aluminum Sulfate Thin Films on Titania Particles Coated with Organic Self-Assembled Monolayers, Chem. Mater., 10, 8, 1998, pp. 2135.

Willner, Itamar; Photoswitchable biomaterials: en route to optobioelectronic systems, Acc. Chem. Res., 30, 1997, pp. 347-356

Winkler, J. D.; Deshayes, K.; Shao, B.; Photodynamic transport of metal ions, J. Amer. Chem. Soc., 111, 1989, pp. 769-770.

Yoneyama, Hiroshi; Toyoguchi, Yoshinori; Tamura, Hideo; Reduction of methylene blue on illuminated titanium dioxide in methanolic and aqueous solutions, J. Phys. Chem., 76 (23), 1972, pp. 3460-4.

We claim:

1. A redox-switchable material which comprises:
a solid semiconductor; and
a redox-active moiety adsorbed, bonded or both to the surface of the solid semiconductor,
wherein the redox-active moiety also comprises a selective complexing moiety.

2. The material of claim 1 wherein the selective complexing moiety is a cryptand.

3. The material of claim 1 wherein the selective complexing moiety is a crown ether.

4. The material of claim 1 wherein the redox-active moiety comprises a ferrocene.

5. The material of claim 1 wherein the redox-active moiety comprises an acridine.

6. The material of claim 1 wherein the redox-active material comprises a quinone.

7. A reversible redox system which comprises a redox-switchable material of claim 1 in contact with a source of electrons.

8. The reversible redox system of claim 7 also in contact with an electron acceptor.

9. A photoerasable writing media comprising the redox-switchable material of claim 1.

10. A electrochromic or photochromic material which comprises the redox-switchable material of claim 1.

11. A catalyst which comprises the redox-switchable material of claim 1.

12. A method for storage of light energy which comprises the step of employing a redox-switchable material of claim 1 which comprises a redox-active moiety adsorbed, bonded or both to the surface of a photoactive solid semiconductor to mediate or catalyze a chemical reaction.

13. The method of claim 12 wherein the redox switchable moiety is selected from the group consisting of a cryptand and a crown ether.

14. The material of claim 1 wherein the semiconductor is hydrophobic.

15. The material of claim 14 wherein the redox-active moiety is covalently bonded to the surface of the hydrophobic semiconductor.

16. The material of claim 15 wherein the redox-active moiety is covalently bonded to the surface of the hydrophobic semiconductor through a linker group.

17. The material of claim 16 wherein the linker group is a hydrocarbon linker group.

18. The reversible redox system of claim 7 further comprising a light source to irradiate the semiconductor to generate electron-hole pairs.

19. The reversible system of claim 7 in contact with an aqueous solution containing an oxidizing agent wherein the redox-active moiety in its oxidized state can be photoreduced upon irradiation of the semiconductor and in its reduced state can be oxidized by the oxidizing agent.

20. The system of claim 19 wherein the oxidizing agent is oxygen.

21. The system of claim 20 wherein the oxygen is present during photoreduction of the redox-active moiety.

22. The method of claim 12 wherein the redox-active moiety comprises a ferrocene.

23. The method of claim 12 wherein the semiconductor is hydrophobic.

24. The method of claim 23 wherein the redox-active moiety is covalently bonded to the surface of the hydrophobic semiconductor.

25. A redox-switchable material which comprises:
   a solid semiconductor; and
   a redox-active moiety adsorbed, bonded or both to the surface of the solid semiconductor, wherein the semiconductor is hydrophobic.

26. The material of claim 25 wherein the redox-active moiety is covalently bonded to the surface of the hydrophobic semiconductor.

27. The material of claim 26 wherein the redox-active moiety is covalently bonded to the surface of the hydrophobic semiconductor through a linker group.

28. The material of claim 27 wherein the linker group is a hydrocarbon linker group.

29. The material of claim 25 wherein the hydrophobic solid semiconductor comprises particles of semiconductor coated with surfactant.

30. The material of claim 25 wherein the hydrophobic solid semiconductor comprises particles of semiconductor covalently bonded to hydrophobic moieties.

31. A reversible redox system which comprises a redox-switchable material in contact with a source of electrons and further comprising a light source to irradiate the semiconductor to generate electron-hole pairs, wherein the redox-switchable material comprises:
   a solid semiconductor; and
   a redox-active moiety adsorbed, bonded or both to the surface of the solid semiconductor.

32. The reversible system of claim 31 in contact with an aqueous solution containing an oxidizing agent wherein the redox-active moiety in its oxidized state can be photoreduced upon irradiation of the semiconductor and in its reduced state can be oxidized by the oxidizing agent.

33. The system of claim 32 wherein the oxidizing agent is oxygen.

34. The system of claim 33 wherein the oxygen is present during photoreduction of the redox-active moiety.

* * * * *